(12) United States Patent
Shimbori

(10) Patent No.: US 7,816,072 B2
(45) Date of Patent: Oct. 19, 2010

(54) POSITIVE RESIST COMPOSITION AND METHOD FOR FORMING RESIST PATTERN

(75) Inventor: Hiroshi Shimbori, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 269 days.

(21) Appl. No.: 11/913,306

(22) PCT Filed: Apr. 26, 2006

(86) PCT No.: PCT/JP2006/308692
§ 371 (c)(1),
(2), (4) Date: Oct. 31, 2007

(87) PCT Pub. No.: WO2006/120896
PCT Pub. Date: Nov. 16, 2006

(65) Prior Publication Data
US 2009/0068594 A1  Mar. 12, 2009

(30) Foreign Application Priority Data
May 2, 2005 (JP) ............... 2005-134025
May 2, 2005 (JP) ............... 2005-134026
May 10, 2005 (JP) ............... 2005-137296

(51) Int. Cl.
*G03F 7/00* (2006.01)
*G03F 7/20* (2006.01)

(52) U.S. Cl. .............. 430/394; 430/270.1; 430/905; 430/913

(58) Field of Classification Search ........... 430/270.1, 430/394, 905, 913
See application file for complete search history.

(56) References Cited

U.S. PATENT DOCUMENTS

| 5,399,462 | A | 3/1995 | Sachdev et al. |
| 5,948,589 | A | 9/1999 | Sato et al. |
| 5,976,760 | A | 11/1999 | Oomori et al. |
| 6,004,724 | A | 12/1999 | Yamato et al. |
| 6,033,828 | A * | 3/2000 | Shimada et al. ......... 430/270.11 |
| 6,764,808 | B2 * | 7/2004 | Okoroanyanwu et al. ... 430/311 |
| 7,033,727 | B2 * | 4/2006 | Kodama ................ 430/270.1 |
| 7,189,492 | B2 * | 3/2007 | Kodama et al. .......... 430/270.1 |
| 2003/0060055 | A1 | 3/2003 | Kamijima |

(Continued)

FOREIGN PATENT DOCUMENTS

EP  1500977 A1 *  1/2005

(Continued)

OTHER PUBLICATIONS

Machine translation of JP 2005-10215 (no date).*

(Continued)

*Primary Examiner*—Amanda C. Walke
(74) *Attorney, Agent, or Firm*—Knobbe, Martens, Olson & Bear, LLP

(57) ABSTRACT

A positive resist composition for producing MEMS using an electron beam, the composition comprising a resin component (A) that displays increased alkali solubility under the action of acid, and an acid generator component (B) that generates acid upon irradiation, wherein the resin component (A) is a resin prepared by protecting a portion of all the hydroxyl groups within an alkali-soluble novolak resin with acid-dissociable, dissolution-inhibiting groups.

5 Claims, 4 Drawing Sheets

U.S. PATENT DOCUMENTS

| | | |
|---|---|---|
| 2003/0082484 A1 | 5/2003 | Sato et al. |
| 2007/0218406 A1 * | 9/2007 | Mizutani et al. ......... 430/270.1 |

FOREIGN PATENT DOCUMENTS

| | | |
|---|---|---|
| EP | 1619553 | 1/2006 |
| EP | 1835342 A2 * | 9/2007 |
| JP | 59194834 | 11/1983 |
| JP | 03218005 | 9/1991 |
| JP | 06289614 | 10/1994 |
| JP | 07134412 | 5/1995 |
| JP | 08029987 | 2/1996 |
| JP | 09007924 | 1/1997 |
| JP | 10148644 | 6/1998 |
| JP | 11329939 | 11/1999 |
| JP | 2002258481 | 9/2002 |
| JP | 2003055341 | 2/2003 |
| JP | 2003177536 | 6/2003 |
| JP | 2004354609 | 12/2004 |
| JP | 2005010215 | 1/2005 |
| JP | 2005070153 | 3/2005 |

OTHER PUBLICATIONS

Machine translation of JP 2004-354609 (no date).*
Machine translation JP 2005-070153 (no date).*
International Search Report from PCT/JP2006/308692, mailed Jul. 18, 2006.

* cited by examiner

US 7,816,072 B2

POSITIVE RESIST COMPOSITION AND METHOD FOR FORMING RESIST PATTERN

RELATED APPLICATIONS

This application is the U.S. National Phase filing under 35 U.S.C. §371 of PCT/JP2006/308692, filed Apr. 26, 2006, which designated the United States and was published in a language other than English, which claims priority under 35 U.S.C. §119(a)-(d) to Japanese Patent Application No. 2005-134025, filed May 2, 2005; Japanese Patent Application No. 2005-134026, filed May 2, 2005; and Japanese Patent Application No. 2005-137296, filed May 10, 2005. The content of these applications is incorporated herein by reference in their entireties.

TECHNICAL FIELD

The present invention relates to a positive resist composition and a method for forming a resist pattern. Specifically, the present invention relates to a positive resist composition and method for forming a resist pattern that can be used favorably in the production of MEMS (Micro Electro Mechanical Systems) such as magnetic heads, a positive resist composition and method for forming a resist pattern that can be used in an exposure step that uses at least two exposure light sources selected from amongst g-line radiation, i-line radiation, a KrF excimer laser and an electron beam, and a positive resist composition and method for forming a resist pattern for use with an electron beam.

BACKGROUND ART

In the production of semiconductor elements and liquid crystal display elements and the like, microfabrication techniques based on lithography techniques are widely used, and in recent years, advances in these lithography techniques have lead to rapid progress in the field of miniaturization.

Typically, these miniaturization techniques involve shortening the wavelength of the exposure light source. Conventionally, as described above, ultraviolet radiation typified by g-line (436 nm) and i-line (365 nm) radiation has been used, but nowadays KrF excimer lasers (248 nm) are the main light source used in mass production, and ArF excimer lasers (193 nm) are now also starting to be introduced in mass production. Furthermore, research is also being conducted into lithography techniques that use $F_2$ excimer lasers (157 nm), extreme ultra violet radiation (EUV), and electron beams (EB) and the like as the light source (radiation source).

The resist materials used in lithography techniques must have favorable sensitivity relative to the exposure light source. Generally, a base resin with a film-forming capability is used in the resist material. Conventionally, g-line and i-line radiation have been the most common exposure light sources, and if these light sources are used, then in the case of positive resists, (non-chemically amplified) positive resist compositions that use an alkali-soluble novolak resin as the base resin and a quinonediazide group-containing compound as a photosensitive component have been widely used.

With recent shortening of the wavelength of the exposure light source and increased demands for ever finer dimensions, improved sensitivity and resolution relative to these new light sources are now required of the resist materials. Accordingly, since the advent of the KrF excimer laser, chemically amplified resist compositions that include a base resin and an acid generator that generates acid upon exposure have become the most common type of resist material. In a chemically amplified resist, for example in the case of a positive resist, the resist composition includes a resin that contains acid-dissociable, dissolution-inhibiting groups and displays increased alkali solubility under the action of acid, and an acid generator, and during resist pattern formation, when an acid is generated from the acid generator by exposure, the exposed portions become alkali-soluble.

Furthermore, as the wavelength of the exposure light source has shortened, the base resin used in the resist material has also changed, and for example in the case where a KrF excimer laser is used as the light source, a polyhydroxystyrene (PHS) based resin in which the hydroxyl groups have been protected with acid-dissociable, dissolution-inhibiting groups is generally used. Furthermore, in the case where an ArF excimer laser is used as the light source, a resin having structural units derived from (meth)acrylic acid within the main chain (namely, an acrylic-based resin) in which the carboxyl groups have been protected with acid-dissociable, dissolution-inhibiting groups is generally used.

On the other hand, one technique that has been attracting considerable attention recently is MEMS. MEMS are highly advanced micro systems in which micromachining techniques that enable three dimensional microfabrication are used to integrate a variety of microstructures (including functional elements such as sensors, electrodes, wiring, and connection terminals such as bumps and leads) on top of a substrate. MEMS are expected to expand into a variety of fields including the telecommunications, automotive, medical and biotechnology fields, as the various sensors and the like for the magnetic heads of magnetic recording media and the like.

The micromachining techniques used in the production of these MEMS typically employ lithography techniques. For example, patent reference 1 discloses a method of producing a microdevice such as a magnetic head using a resist pattern of a specific shape.

As MEMS undergo ever increasing miniaturization, resist materials capable of forming high-resolution resist patterns are being demanded in order to enable the required microfabrication to be conducted.

As described above, these miniaturization techniques typically involve shortening the wavelength of the exposure light source, and recently, there have been growing demands for a resist material that exhibits favorable sensitivity to electron beams and is capable of forming high-resolution patterns, for use as a resist material that can be applied to MEMS production processes using an electron beam.

However, although a conventional chemically amplified positive resist composition that uses, for example, a PHS-based resin in which the hydroxyl groups have been protected with acid-dissociable, dissolution-inhibiting groups as the resin component exhibits sensitivity relative to an electron beam, the composition does not offer satisfactory levels of the various resistance properties required for MEMS production.

For example, in MEMS production, in order to form minute metal structures such as wiring and connection terminals, a resist material is used to form a resist pattern, and plating is then conducted within the resist-free portions of the resist pattern, but this means that the resist requires resistance to the plating solution or the like (namely, plating resistance). Furthermore, the resist also requires heat resistance to the heat applied during the ion milling or etching or the like that is conducted during post-production steps.

However, if the type of conventional chemically amplified positive resist composition described above is used, then resist pattern swelling and the like occur during the plating treatment, which can cause problems such as peeling of the plating. Furthermore, if heated at a high temperature such as 130° C., the shape of the resist pattern tends to deteriorate as a result of heat sag (wherein the pattern softens as a result of the heat, and is unable to retain its shape) and the like.

Furthermore, techniques for forming high-resolution patterns are being investigated not only from a materials perspective, but also from a process perspective.

For example, multilayer resist methods, including a three-layer resist method that uses a laminate prepared by laminating an organic film, an intermediate film formed from an inorganic film of silica or the like, and a resist film onto a substrate, and a two-layer resist method that is superior to the three-layer resist method in terms of requiring fewer production steps, have also been proposed (for example, see patent references 2 and 3). Using these multilayer methods enables high levels of resolution to be achieved.

However, multilayer resist methods suffer from various problems including reductions in the yield and the throughput as a result of the increase in the number of process steps, and increased costs.

The problem of throughput is particularly critical for lithography processes that use an electron beam. In such lithography processes, although very high levels of resolution can be achieved, the exposure is usually conducted in a vacuum, either by conducting exposure through a desired mask pattern, or by direct patterning. As a result, a pressure reduction operation and purge operation must be conducted, meaning the process takes considerably longer than a process that uses an excimer laser or the like. Furthermore, particularly in the case of direct patterning using an electron beam, conducting patterning of the entire substrate takes an extremely long period of time.

Accordingly, in recent years, methods that involve conducting exposure with two or more different light sources (hereafter referred to as "mix and match" methods) are attracting considerable attention.

In these methods, formation of the entire pattern using the light source that is required for formation of very fine patterns, such as an electron beam, is replaced with a method in which the very fine patterns are formed with an electron beam, whereas those rough patterns that do not require a very high level of resolution are formed using a different light source such as a KrF excimer laser, with the exposure conducted via a mask pattern in a single step, and by reducing the time required to form the rough patterns, an improvement in the throughput can be achieved.

However, as described above, the composition of resist materials generally differs depending on the nature of the exposure light source being used, and resist materials tend not to exhibit sensitivity to three or more different light sources. For example, the non-chemically amplified resists used for exposure with g-line or i-line radiation exhibit no sensitivity relative to a KrF excimer laser or electron beam, meaning this combination of light sources cannot be used in a mix and match method. Consequently, there are restrictions as to the combinations of light sources that can be used in a mix and match method.

Accordingly, there is considerable demand for a resist material that can be used within mix and match methods using combinations of any of the various light sources. Of the various possibilities, the demands are particularly strong for a resist material that can be used in a mix and match method that employs a combination of an electron beam, which enables formation of very high-resolution patterns, with another light source, and particularly the most widely used g-line and/or i-line radiation sources.

As described above, recent shortening of the wavelength of the exposure light source and increased demands for ever finer dimensions have lead to demands for resist materials that exhibit improved sensitivity and resolution relative to these light sources, and for example, patent reference 4 proposes a chemically amplified positive resist composition for a system LCD that includes an alkali-soluble novolak resin in which a portion of all the hydroxyl groups have been protected with acid-dissociable, dissolution-inhibiting groups, and an oxime sulfonate-based acid generator (for example, see patent reference 4). This chemically amplified positive resist composition for a system LCD can be used in an exposure step that uses ultra violet radiation typified by g-line or i-line radiation.

In order to enable formation of even finer patterns, the inventors of the present invention used the positive resist composition described above and conducted tests on pattern formation using an electron beam. However, the resolution was unsatisfactory.

[Patent Reference 1]
Japanese Unexamined Patent Application, First Publication No. 2002-110536

[Patent Reference 2]
Japanese Unexamined Patent Application, First Publication No. Hei 6-202338

[Patent Reference 3]
Japanese Unexamined Patent Application, First Publication No. Hei 8-29987

[Patent Reference 4]
Japanese Unexamined Patent Application, First Publication No. 2004-354609

DISCLOSURE OF INVENTION

Problems to be Solved by the Invention

The present invention addresses the circumstances described above, with a first object of providing a positive resist composition and a method for forming a resist pattern that exhibit favorable sensitivity to an electron beam, enable formation of a high-resolution resist pattern with excellent plating resistance and heat resistance, and are ideal for producing MEMS using an electron beam.

Furthermore, a second object of the present invention is to provide a positive resist composition and a method for forming a resist pattern that exhibit favorable sensitivity to g-line, i-line radiation, a KrF excimer laser and an electron beam, and can be used in a mix and match process in which exposure is conducted using at least two exposure light sources selected from amongst g-line radiation, i-line radiation, a KrF excimer laser, and an electron beam.

Furthermore, a third object of the present invention is to provide a positive resist composition and a method for forming a resist pattern that enable the formation of a high-resolution resist pattern.

Means for Solving the Problems

In order to achieve the objects described above, the present invention adopts the aspects described below.

In other words, a first aspect of the present invention is a positive resist composition for producing MEMS using an electron beam, the composition containing a resin component (A) that displays increased alkali solubility under the action of acid, and an acid generator component (B) that generates acid upon irradiation, wherein the resin component (A) is a resin prepared by protecting a portion of all the hydroxyl groups within an alkali-soluble novolak resin with acid-dissociable, dissolution-inhibiting groups.

Furthermore, a second aspect of the present invention is a method for forming a resist pattern that includes the steps of: forming a resist film on a substrate using the positive resist composition according to the first aspect, selectively exposing the resist film using an electron beam, and subjecting the resist film to alkali developing to form a resist pattern.

Furthermore, as a result of intensive investigation, the inventors of the present invention also discovered that by using a component with specific properties as the acid generator component, the second object described above could be achieved, and they were therefore able to complete the present invention.

In other words, a third aspect of the present invention is a positive resist composition for use within an exposure step that uses at least two exposure light sources selected from amongst g-line radiation, i-line radiation, a KrF excimer laser and an electron beam, wherein the composition includes:

a resin component (A)' that contains acid-dissociable, dissolution-inhibiting groups and displays increased alkali solubility under the action of acid, and an acid generator component (B)' that generates acid upon irradiation with g-line radiation, i-line radiation, a KrF excimer laser or an electron beam.

Furthermore, a fourth aspect of the present invention is a method for forming a resist pattern that includes the steps of: forming a resist film on a substrate using the positive resist composition according to the third aspect, selectively exposing the resist film using at least two exposure light sources selected from amongst g-line radiation, i-line radiation, a KrF excimer laser and an electron beam, and subjecting the resist film to alkali developing to form a resist pattern.

In the above first through fourth aspects of the present invention, the term "exposure" includes irradiation with an electron beam.

Furthermore, as a result of intensive investigation, the inventors of the present invention also discovered that by using a novolak resin having acid-dissociable, dissolution-inhibiting groups as the resin component, and combining two specific acid generators as the acid generator component, the third object of the present invention could be achieved, and they were therefore able to complete the present invention.

In other words, a fifth aspect of the present invention is a positive resist composition for use with an electron beam, containing a resin component (A)" that contains acid-dissociable, dissolution-inhibiting groups and displays increased alkali solubility under the action of acid, and an acid generator component (B)" that generates acid upon irradiation, wherein the resin component (A)" is a resin prepared by protecting a portion of all the hydroxyl groups within an alkali-soluble novolak resin with acid-dissociable, dissolution-inhibiting groups, and the acid generator component (B)" includes an oxime sulfonate-based acid generator (B1) and an onium salt-based acid generator (B2).

Furthermore, a sixth aspect of the present invention is a method for forming a resist pattern that includes the steps of: forming a resist film on a substrate using the positive resist composition for use with an electron beam according to the fifth aspect, selectively exposing the resist film, and subjecting the resist film to alkali developing to form a resist pattern.

In the above fifth and sixth aspects of the present invention, the term "exposure" includes direct patterning with an electron beam, and irradiation through a mask with an electron beam.

EFFECTS OF THE INVENTION

According to the first and second aspects of the present invention, a positive resist composition and a method for forming a resist pattern are provided that exhibit favorable sensitivity to an electron beam, enable formation of a high-resolution resist pattern with excellent plating resistance and heat resistance, and are ideal for producing MEMS using an electron beam.

According to the third and fourth aspects of the present invention, a positive resist composition and a method for forming a resist pattern are provided that exhibit favorable sensitivity to g-line, i-line radiation, a KrF excimer laser and an electron beam, and can be used in a process in which exposure is conducted using at least two exposure light sources selected from amongst g-line radiation, i-line radiation, a KrF excimer laser, and an electron beam. By employing this positive resist composition and method for forming a resist pattern, a mix and match exposure can be conducted using any of g-line radiation, i-line radiation, a KrF excimer laser, and an electron beam.

According to the fifth and sixth aspects of the present invention, a positive resist composition for use with an electron beam and a method for forming a resist pattern that enable the formation of a high-resolution resist pattern are provided.

DESCRIPTION OF THE REFERENCE SYMBOLS

Figure 1A:
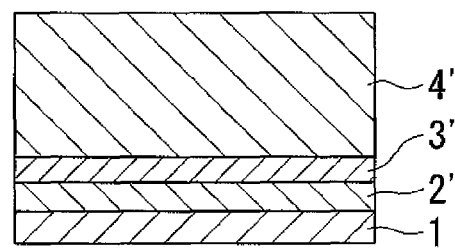
FIG. 1A is a schematic illustration describing a step of forming a magnetic film pattern by ion etching using a resist pattern as a mask.

1 Substrate
2' Magnetic film
2 Magnetic film pattern
3' Base film
3 Base pattern
4' Resist film
4 Resist pattern
5 Pattern
6 Electrode film
10 Magnetic head (read portion)
11 Plating seed layer
12 Resist pattern
13' Magnetic film
13 Magnetic film pattern
14 Large-area pattern
15 Trench pattern
16 Resist pattern
17 Plating pattern

BEST MODE FOR CARRYING OUT THE INVENTION

First is a description of the first and second aspects of the present invention.

<Positive Resist Composition of the First Aspect>

A positive resist composition of the first aspect of the present invention includes a resin component (A) (hereafter also referred to as the component (A)) that displays increased alkali solubility under the action of acid, and an acid generator component (B) (hereafter also referred to as the component (B)) that generates acid upon irradiation.

When the acid generated from the component (B) by exposure acts upon the component (A), the entire component (A) changes from an alkali-insoluble state to an alkali-soluble state. As a result, when a resist film formed from the positive resist composition is either selectively exposed during the formation of a resist pattern, or alternatively is exposed and then subjected to post exposure baking, the exposed portions of the resist shift to an alkali-soluble state, whereas the unexposed portions remain insoluble in alkali, meaning alkali developing can then be used to form a positive resist pattern.

Component (A)

In a positive resist composition according to the first aspect of the present invention, the component (A) is a resin prepared by protecting a portion of all the hydroxyl groups within an alkali-soluble novolak resin with acid-dissociable, dissolution-inhibiting groups.

In the component (A), there are no particular restrictions on the unprotected alkali-soluble novolak resin (hereafter also referred to as the novolak resin (a)) in which none of the hydroxyl groups have been protected with acid-dissociable, dissolution-inhibiting groups, and this resin may be selected appropriately from amongst the resins typically used as the film-forming material within conventional positive resist compositions, although preferred resins include novolak resins produced by a condensation reaction between an aromatic hydroxy compound, and an aldehyde and/or ketone.

Examples of aromatic hydroxy compounds that can be used in the synthesis of the novolak resin (a) include phenol; cresols such as m-cresol, p-cresol and o-cresol; xylenols such as 2,3-xylenol, 2,5-xylenol, 3,5-xylenol and 3,4-xylenol; alkylphenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, and 2-tert-butyl-5-methylphenol; alkoxyphenols such as p-methoxyphenol, m-methoxyphenol, p-ethoxyphenol, m-ethoxyphenol, p-propoxyphenol, and m-propoxyphenol; isopropenylphenols such as o-isopropenylphenol, p-isopropenylphenol, 2-methyl-4-isopropenylphenol, and 2-ethyl-4-isopropenylphenol; arylphenols such as phenylphenol; and polyhydroxyphenols such as 4,4'-dihydroxybiphenyl, bisphenol A, resorcinol, hydroquinone, and pyrogallol. These phenols may be used either alone, or in combinations of two or more different compounds.

Examples of aldehydes that can be used in the synthesis of the novolak resin (a) include formaldehyde, paraformaldehyde, trioxane, acetaldehyde, propionaldehyde, butyraldehyde, trimethylacetaldehyde, acrolein, crotonaldehyde, cyclohexanealdehyde, furfural, furylacrolein, benzaldehyde, terephthaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamaldehyde. These aldehydes may be used either alone, or in combinations of two or more different compounds.

Of these aldehydes, in terms of availability, the use of formaldehyde is preferred. The use of a combination of formaldehyde with a hydroxybenzaldehyde such as o-hydroxybenzaldehyde, m-hydroxybenzaldehyde or p-hydroxybenzaldehyde is particularly preferred as it yields superior heat resistance.

Examples of ketones that can be used in the synthesis of the novolak resin (a) include acetone, methyl ethyl ketone, diethyl ketone, and diphenyl ketone. These ketones may be used either alone, or in combinations of two or more different compounds.

Furthermore, a suitable combination of an aforementioned aldehyde and a ketone may also be used.

The novolak resin (a) can be produced by subjecting the aromatic hydroxy compound and the aldehyde and/or ketone to a conventional condensation reaction in the presence of an acid catalyst. Examples of acid catalysts that can be used include hydrochloric acid, sulfuric acid, formic acid, oxalic acid, and para-toluenesulfonic acid.

The weight average molecular weight (Mw) (the polystyrene equivalent value determined by gel permeation chromatography (GPC)) of the novolak resin (a), namely, the Mw value of the component (A) prior to protection with the acid-dissociable, dissolution-inhibiting groups, is preferably within a range from 2,000 to 50,000, even more preferably from 3,000 to 20,000, and is most preferably from 4,000 to 15,000. Provided this Mw value is at least 2,000, favorable coating properties are obtained when the positive resist composition is dissolved in an organic solvent and applied to a substrate, whereas provided the Mw value is no greater than 50,000, favorable resolution is obtained.

In the present invention, the novolak resin (a) is preferably subjected to a treatment for separating and removing low molecular weight materials prior to protection with the acid-dissociable, dissolution-inhibiting groups. This treatment further improves the heat resistance.

In this specification, the term "low molecular weight materials" includes the aromatic hydroxy compound, aldehyde, and ketone monomers that were used in the synthesis of the novolak resin (a) but remain unreacted at the completion of the reaction, as well as dimers in which two of these monomer molecules are bonded together, and trimers in which three molecules are bonded together (namely, monomers, dimers and trimers and the like).

There are no particular restrictions on the method used for separating and removing the low molecular weight materials, and conventional separation and removal methods such as purification methods using ion exchange resins, and methods using combinations of good solvents (such as alcohols) and poor solvents (such as water) for the resin can be used. The former method enables the removal of not only the low molecular weight materials, but also acid components and metal components.

The yield from the low molecular weight material separation and removal method is preferably within a range from 50 to 95% by weight. Provided the yield is at least 50% by weight, the solubility of the resulting resin in an aqueous alkali solution can be satisfactorily increased under the action of the acid generated from the component (B) described below. Accordingly, a large difference in the solubility rate can be achieved between the exposed portions and the unexposed portions, meaning a favorable resolution can be achieved. Furthermore, provided the yield is no greater than 95% by weight, the effect achieved by conducting the separation and removal manifests favorably.

Furthermore, the quantity of low molecular weight materials with a Mw value of 500 or less, as determined from a GPC chart, is typically no more than 15%, and is even more preferably 12% or less. By ensuring this quantity is no more than 15%, a favorable improvement in the heat resistance of the resist pattern can be achieved, and the quantity of sublimates produced during heat treatment can be suppressed.

The component (A) is a resin prepared by protecting a portion of all the hydroxyl groups within this novolak resin (a) with acid-dissociable, dissolution-inhibiting groups. Protecting a portion of all the hydroxyl groups within the novolak resin (a) with acid-dissociable, dissolution-inhibiting groups causes the component (A) to become either sparingly soluble or insoluble in alkali, and when the acid-dissociable, dissolution-inhibiting groups then dissociate under the action of acid, the resin changes to an alkali-soluble state.

The acid-dissociable, dissolution-inhibiting groups within the component (A) may be any group that dissociates in the presence of the acid generated from the component (B) described below, and suitable groups include straight-chain or branched-chain alkoxyalkyl groups such as a 1-ethoxymethyl group, 1-ethoxyethyl group, 1-propoxymethyl group, 1-propoxyethyl group, 1-n-butoxymethyl group, 1-iso-butoxymethyl group, and 1-tert-butoxymethyl group; cyclic acetal groups such as a tetrahydrofuranyl group or tetrahydropyranyl group; alkoxycarbonylalkyl groups such as a tert-butoxycarbonyl group, tert-butoxycarbonylmethyl group, or tert-butoxycarbonylethyl group; and trialkylsilyl groups such as a trimethylsilyl group, triethylsilyl group, or triphenylsilyl group.

The component (A) can be obtained by reacting the above novolak resin (a) with the compound that corresponds with the aforementioned acid-dissociable, dissolution-inhibiting group.

In the present invention, the component (A) is preferably the reaction product of a novolak resin (a) and a compound represented by a general formula (I) shown below (hereafter also referred to as the compound (I)), as such resins offer particularly superior effects for the present invention.

[Formula 1]

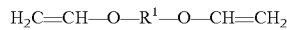   (I)

[wherein, R1 represents either an alkylene group of 1 to 10 carbon atoms that may contain a substituent group and may include an ether linkage within the main chain, or a group represented by a general formula (II) shown below]

[Formula 2]

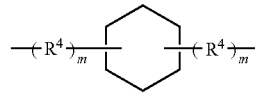   (II)

[wherein, $R^4$ represents an alkylene group of 1 to 10 carbon atoms that may contain a substituent group, and m represents either 0 or 1]

In the general formula (I), $R^1$ represents either a branched-chain or straight-chain alkylene group of 1 to 10 carbon atoms that may contain a substituent group and may include an ether linkage within the main chain, or a group represented by the above general formula (II).

Examples of suitable substituent groups that may exist within the alkylene group of $R^1$ include a methyl group or an ethyl group or the like.

Furthermore, the alkylene group may include an ether linkage (—O—) within the main chain.

In the general formula (II), each $R^4$ represents, independently, a branched-chain or straight-chain alkylene group of 1 to 10 carbon atoms that may contain a substituent group, and examples of this alkylene group include the same groups as the alkylene group $R^1$.

A methylene group is particularly preferred as $R^4$.

In the present invention, $R^1$ is preferably —$C_4H_8$—, —$C_2H_4OC_2H_4$—, —$C_2H_4OC_2H_4OC_2H_4$—, or a group represented by the general formula (II). Of these, groups represented by the general formula (II) are particularly desirable. Of the groups of the general formula (II), groups in which $R^4$ is a methylene group and m is 1 are particularly preferred.

When the novolak resin (a) is reacted with the compound (I), at least one of the two vinyl groups at the terminals of the compound (I) reacts with a hydroxyl group of the novolak resin (a), for example, with a side-chain phenolic hydroxyl group, thereby forming a reaction product.

The reaction product contains at least one of either structural units formed when one of the two vinyl groups at the terminals of the compound (I) bonds to a hydroxyl group within the novolak resin (a), and/or structural units formed when both of the two vinyl groups at the terminals of the compound (I) bond to hydroxyl groups within the novolak resin (a).

Here, the term "structural unit" refers to a monomer unit that contributes to formation of the resin (polymer).

Specifically, in the case where one of the two vinyl groups at the terminals of the compound (I) bonds to a single side-chain phenolic hydroxyl group within the novolak resin (a), a structural unit (1A) represented by a formula (1A) shown below is formed. Furthermore, when the two vinyl groups at the terminals of the compound (I) bond to two side-chain phenolic hydroxyl group within the novolak resin (a), an intermolecular cross-link is formed, forming a structural unit (1B) represented by a formula (1B) shown below.

Normally, a reaction product is obtained that includes both structural units in which only one terminal of the compound (I) has been bonded (such as the structural unit (1A)), and structural units in which both of the terminals have been bonded (such as the structural unit (1B)).

[Formula 3]

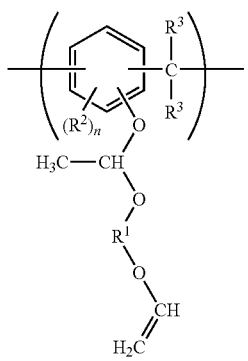

(1A)

[Formula 4]

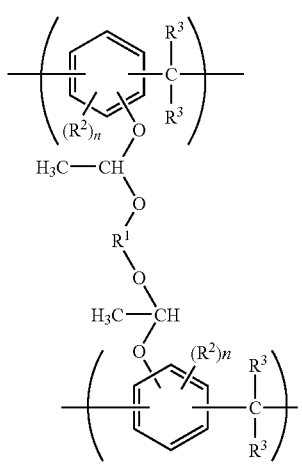

(1B)

In the above formulas, $R^1$ is the same as $R^1$ within the above formula (I).

For those cases where the aromatic hydroxy compound described above in the section relating to the novolak resin is an aromatic hydroxy compound containing a benzene ring as the aromatic ring, each $R^2$ in the above formula represents, independently, a substituent group bonded to that benzene ring, and n represents the number of such substituent groups.

Each $R^3$ represents, independently, a group derived from the aldehyde and/or ketone described above in the section relating to the novolak resin.

As described above, either one of, or both, the two vinyl groups at the terminals of the compound (I) react with a hydroxyl group within the novolak resin (a), such as a side-chain phenolic hydroxyl group, and the monovalent or bivalent group formed as a result of the cleavage of the vinyl group double bond functions as an acid-dissociable, dissolution-inhibiting group. In other words, because the compound (I) reacts with hydroxyl groups within the novolak resin (a), the resulting reaction product exhibits poorer solubility in aqueous alkali solutions than the novolak resin (a). Furthermore, when a positive resist composition containing this reaction product is applied to a substrate and subsequently heated, the unprotected hydroxyl groups within the reaction product react with the terminal vinyl group of the above structural units (A1) to form cross-linked structures, and as a result, the solubility within aqueous alkali solutions decreases even more, meaning the composition is almost insoluble in the alkali developing liquid such as an aqueous alkali solution used during resist pattern formation. However, when acid is generated from the component (B) by exposure, the acid acts on the cross-linked structures, cleaving the bond between the oxygen atom derived from the hydroxyl group of the novolak resin (a), and the carbon atom bonded to that oxygen atom and derived from the vinyl group of the compound (I), thereby causing the solubility of the positive resist composition in the aqueous alkali solution to increase.

Furthermore, the cross-linked structures dissociate more readily than the acid-dissociable, dissolution-inhibiting groups described above, meaning the dissociation reaction proceeds favorably even when an oxime sulfonate-based acid generator, which generates a much weaker acid than the strong acid generated by an onium salt-based acid generator, is used as the component (B). As a result, the solubility contrast between the exposed portions and unexposed portions is large, enabling the formation of a higher resolution pattern.

Moreover, the formation of the above type of cross-linked structures increases the molecular weight of the component (A) to a value that is from 2 to 20 times greater than the molecular weight of the non-cross-linked component. Consequently, the heat resistance is improved, and even if the formed resist pattern is heated at a temperature of 130° C. or higher, pattern deformation caused by heat sag or the like does not occur, meaning the shape of the pattern is retained. Accordingly, the composition can be used favorably in the production of MEMS.

The reaction between the novolak resin (a) and the compound (I) can be conducted using normal methods, and for example, the reaction can be accelerated by heating the two reactants within a solvent.

The quantity used of the compound (I) is preferably within a range from 1 to 15 parts by weight, and even more preferably from 4 to 8 parts by weight, per 100 parts by weight of the novolak resin (a). Provided this quantity is at least 1 part by weight, thickness loss within the unexposed portions of the resist pattern is minimal, and the resist pattern contrast tends to be large, whereas provided the quantity is no greater than 15 parts by weight, the solubility of the compound within the developing liquid (the aqueous alkali solution) is favorable, the sensitivity is excellent, and patterns are readily resolvable.

In the reaction between the novolak resin (a) and the compound (I), the reaction proceeds even without the use of an acid catalyst, meaning the use of an acid catalyst is not essential, and in actual fact, the presence of acid components such as an acid catalyst within the reaction system tends to be undesirable in terms of the storage stability following preparation of the resist composition. Acid components refer to acid catalysts used during the synthesis of the novolak resin (a), and organic acids such as free acid within the reaction solvent, and these acid components can be detected by gas chromatography or the like.

Normal methods can be used for removing such acid components, and suitable methods include the use of ion exchange resins, washing with pure water, and neutralization using an alkali.

Prior to reaction with the compound (I), the concentration of acid components within the novolak resin (a) is preferably no greater than 0.1 ppm, and is even more preferably 0.01 ppm or less.

In the component (A), the proportion of hydroxyl groups protected by acid-dissociable, dissolution-inhibiting groups (the protection ratio), namely, the ratio (%) of the number of hydroxyl groups within the component (A) protected by acid-dissociable, dissolution-inhibiting groups relative to the total number of hydroxyl groups within the novolak resin (a) used as the precursor to the component (A), is preferably within a range from 1 to 30%, even more preferably from 3 to 20%, and is most preferably from 5 to 10%.

The protection ratio for the component (A) can be measured, for example, using proton NMR (nuclear magnetic resonance spectroscopy).

In the present invention, following the protection of the hydroxyl groups with the acid-dissociable, dissolution-inhibiting groups, the component (A) is preferably subjected to a treatment for separating and removing low molecular weight materials. This treatment further improves the heat resistance.

Factors such as the method used for separating and removing the low molecular weight materials, the yield from the low molecular weight material separation and removal method, and the quantity of low molecular weight materials with a Mw value of 500 or less, are as described above for the novolak resin (a).

The weight average molecular weight (Mw) of the component (A) is preferably within a range from 2,000 to 100,000. Provided the Mw value is at least 2,000, the heat resistance is favorable. Furthermore, the coating properties obtained when the positive resist composition is dissolved in an organic solvent and applied to a substrate are also favorable. On the other hand, provided the Mw value is no greater than 100,000, favorable resolution is obtained.

In those cases where the component (A) is not a reaction product of the novolak resin (a) and the compound (I), then in consideration of the resolution and heat resistance, the weight average molecular weight (Mw) of the component (A) is preferably within a range from 3,000 to 20,000, and even more preferably from 4,000 to 15,000.

If the component (A) is a reaction product of the novolak resin (a) and the compound (I), the weight average molecular weight (Mw) of the reaction product is preferably within a range from 10,000 to 100,000, and even more preferably from 20,000 to 60,000. By ensuring this Mw value is at least 10,000, the improvement in the heat resistance of the resist pattern can be enhanced.

Component (B)

As the component (B), any compound that generates acid upon irradiation with an electron beam is suitable, and such acid generators that generate acid upon irradiation with an electron beam can be selected appropriately from amongst the various acid generators that have been proposed for use within conventional chemically amplified resists.

Examples of these acid generators proposed for use with chemically amplified resists are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzyl sulfonate-based acid generators; iminosulfonate-based acid generators, and disulfone-based acid generators.

Of these, oxime sulfonate-based acid generators are particularly desirable as they yield superior effects for the present invention.

In this description, an oxime sulfonate-based acid generator refers to either a compound that contains at least one group represented by a general formula (B-1) shown below, or a compound represented by a general formula (III) or (IV) shown below, wherein the compound generates acid upon irradiation.

[Formula 5]

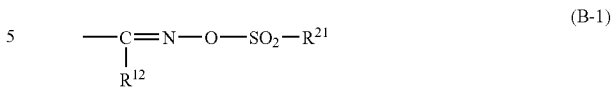

(In the formula (B-1), $R^{21}$ and $R^{22}$ each represent, independently, an organic group.)

The organic groups of $R^{21}$ and $R^{22}$ preferably include carbon atoms, and may also include atoms other than carbon atoms (such as hydrogen atoms, oxygen atoms, nitrogen atoms, sulfur atoms, and halogen atoms (such as fluorine atoms or chlorine atoms)).

The organic group of $R^{21}$ is preferably a straight-chain, branched or cyclic alkyl group or aryl group. These alkyl groups or aryl groups may also include a substituent group. There are no particular restrictions on such substituent groups, and suitable examples include a fluorine atom, or a straight-chain, branched, or cyclic alkyl group of 1 to 6 carbon atoms. Here, the expression "include a substituent group" means that either a portion of, or all of, the hydrogen atoms of the alkyl group or aryl group may be substituted with substituent groups.

The alkyl group preferably contains from 1 to 20 carbon atoms, even more preferably from 1 to 10 carbon atoms, even more preferably from 1 to 8 carbon atoms, and most preferably from 1 to 6 carbon atoms. Furthermore, alkyl groups that are partially or completely halogenated (hereafter also referred to as haloalkyl groups) are preferred. A partially halogenated alkyl group is an alkyl group in which a portion of the hydrogen atoms have been substituted with halogen atoms, whereas a completely halogenated alkyl group is an alkyl group in which all of the hydrogen atoms have been substituted with halogen atoms. Examples of the halogen atoms include fluorine atoms, chlorine atoms, bromine atoms or iodine atoms, although fluorine atoms are particularly desirable. In other words, the haloalkyl group is preferably a fluoroalkyl group.

The aryl group preferably contains from 4 to 20 carbon atoms, even more preferably from 4 to 10 carbon atoms, and most preferably from 6 to 10 carbon atoms. Aryl groups that are partially or completely halogenated are preferred. A partially halogenated aryl group is an aryl group in which a portion of the hydrogen atoms have been substituted with halogen atoms, whereas a completely halogenated aryl group is an aryl group in which all of the hydrogen atoms have been substituted with halogen atoms.

As the group $R^{21}$, an alkyl group of 1 to 4 carbon atoms containing no substituent groups, or a fluoroalkyl group of 1 to 4 carbon atoms is the most desirable.

The organic group of $R^{22}$ is preferably a straight-chain, branched, or cyclic alkyl group or aryl group, or a cyano group. Examples of suitable alkyl groups and aryl groups for $R^{22}$ include the same alkyl groups and aryl groups described above in relation to $R^{21}$.

As the group $R^{22}$, a cyano group, an alkyl group of 1 to 8 carbon atoms containing no substituent groups, or a fluoroalkyl group of 1 to 8 carbon atoms is the most desirable.

As the oxime sulfonate-based acid generator, a compound represented by a general formula (III) or (IV) shown below (see U.S. Pat. No. 6,004,724) exhibits a particularly high acid generating efficiency relative to electron beam irradiation, and is consequently ideal.

[Formula 6]

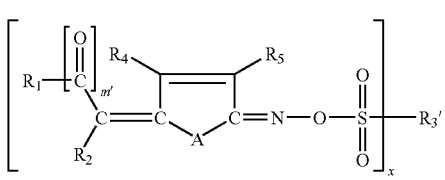
(III)

[In the formula (III), m' represents 0 or 1; X represents 1 or 2; $R_1$ represents a phenyl group or heteroaryl group that may be substituted with one or more $C_1$ to $C_{12}$ alkyl groups, or in the case where m' is 0, may also represent a $C_2$ to $C_6$ alkoxycarbonyl group, a phenoxycarbonyl group or CN (a cyano group); $R_2$ has the same meaning as $R_1$; $R_3'$ represents a $C_1$ to $C_{18}$ alkyl group when X=1, or a $C_2$ to $C_{12}$ alkylene group or a phenylene group when X=2; $R_4$ and $R_5$ each represent, independently, a hydrogen atom, halogen atom, or a $C_1$ to $C_6$ alkyl group; and A represents —S—, —O—, or —N($R_6$)—, wherein $R_6$ represents an alkyl group of 1 to 4 carbon atoms.]

The phenyl group that may be substituted with one or more $C_1$ to $C_{12}$ alkyl groups represented by $R_1$ describes either a phenyl group with no substituents, or a phenyl group in which a portion of the hydrogen atoms are substituted with one or more $C_1$ to $C_{12}$ alkyl groups.

[Formula 7]

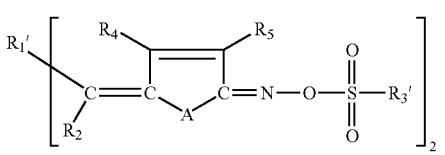
(IV)

[In the formula (IV), $R_1'$ represents a $C_2$ to $C_{12}$ alkylene group; $R_2$, $R_4$, $R_5$, and A are as defined above; and $R_3$ represents a $C_1$ to $C_{18}$ alkyl group.]

Of these compounds, a thiolene-containing oxime sulfonate represented by a formula (V) shown below is preferred.

[Formula 8]

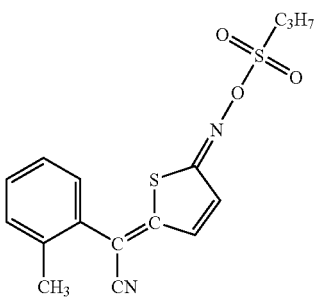
(V)

Furthermore, besides these compounds, further examples of suitable compounds for the component (B) include triazine compounds (VD) [bis(trichloromethyl)triazines] represented by a formula (VI) shown below, suitable combinations of this type of triazine compound (VI) and another triazine compound (VII) [a bis(trichloromethyl)triazine] represented by a formula (VII) shown below (see Japanese Unexamined Patent Application, First Publication No. Hei 6-289614 and Japanese Unexamined Patent Application, First Publication No. Hei 7-134412), compounds represented by a formula (VIII) shown below, and the compound represented by a formula (IX) shown below.

[Formula 9]

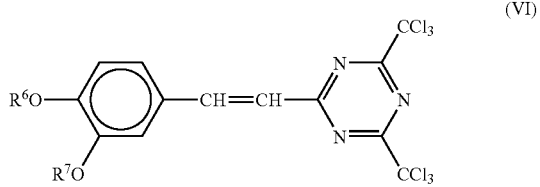
(VI)

(wherein, $R^6$ and $R^7$ each represent, independently, an alkyl group of 1 to 3 carbon atoms)

[Formula 10]

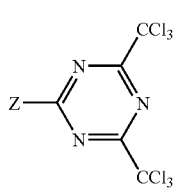
(VII)

(wherein, Z represents a 4-alkoxyphenyl group or the like)

[Formula 11]

(VIII)

$$Ar\left(\begin{array}{c}CN\\C\\\parallel\\N\end{array}-O-\overset{O}{\underset{O}{\overset{\parallel}{S}}}-R\right)_n$$

(In the formula (VIII), Ar represents an unsubstituted or substituted phenyl group (a phenyl group which may, or may not, include a substituent group), or a naphthyl group; R represents an alkyl group of 1 to 9 carbon atoms; and n represents an integer of 2 or 3.)

[Formula 12]

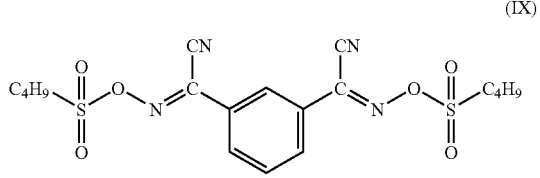
(IX)

Specific examples of the triazine compound (VI) include 2-[2-(3,4-dimethoxyphenyl)ethenyl]-4,6-bis(trichloromethyl)-1,3,5-triazine, 2-[2-(3-methoxy-4-ethoxyphenyl)ethenyl]-4,6-bis(trichloromethyl)-1,3,5-triazine, 2-[2-(3-methoxy-4-propoxyphenyl)ethenyl]-4,6-bis(trichloromethyl)-1,3,5-triazine, 2-[2-(3-ethoxy-4-methoxyphenyl)ethenyl]-4,6-bis(trichloromethyl)-1,3,5-triazine, 2-[2-(3,4-diethoxyphenyl)ethenyl]-4,6-bis(trichloromethyl)-1,3,5-triazine, 2-[2-(3-ethoxy-4-propoxyphenyl)ethenyl]-4,6-bis(trichloromethyl)-1,3,5-triazine, 2-[2-(3-propoxy-4-methoxyphenyl)ethenyl]-4,6-bis(trichloromethyl)-1,3,5-triazine, 2-[2-(3-propoxy-4-ethoxyphenyl)ethenyl]-4,6-bis(trichloromethyl)-1,3,5-triazine, and 2-[2-(3,4-dipropoxyphenyl)ethenyl]-4,6-bis(trichloromethyl)-1,3,5-triazine. These triazine compounds may be used either alone, or in combinations of two or more different compounds.

Specific examples of the triazine compounds (VII) that may be used in combination with an aforementioned triazine compound (VI) include 2-(4-methoxyphenyl)-4,6-bis(trichloromethyl)-1,3,5-triazine, 2-(4-ethoxyphenyl)-4,6-bis(trichloromethyl)-1,3,5-triazine, 2-(4-propoxyphenyl)-4,6-bis(trichloromethyl)-1,3,5-triazine, 2-(4-butoxyphenyl)-4,6-bis(trichloromethyl)-1,3,5-triazine, 2-(4-methoxynaphthyl)-4,6-bis(trichloromethyl)-1,3,5-triazine, 2-(4-ethoxynaphthyl)-4,6-bis(trichloromethyl)-1,3,5-triazine, 2-(4-propoxynaphthyl)-4,6-bis(trichloromethyl)-1,3,5-triazine, 2-(4-butoxynaphthyl)-4,6-bis(trichloromethyl)-1,3,5-triazine, 2-(4-methoxy-6-carboxynaphthyl)-4,6-bis(trichloromethyl)-1,3,5-triazine, 2-(4-methoxy-6-hydroxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(5-ethyl-2-furyl)ethenyl]-4,6-bis(trichloromethyl)-1,3,5-triazine, 2-[2-(5-propyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3-methoxy-5-ethoxyphenyl)ethenyl]-4,6-bis(trichloromethyl)-1,3,5-triazine, 2-[2-(3-methoxy-5-propoxyphenyl)ethenyl]-4,6-bis(trichloromethyl)-1,3,5-triazine, 2-[2-(3-ethoxy-5-methoxyphenyl)ethenyl]-4,6-bis(trichloromethyl)-1,3,5-triazine, 2-[2-(3,5-diethoxyphenyl)ethenyl]-4,6-bis(trichloromethyl)-1,3,5-triazine, 2-[2-(3-ethoxy-5-propoxyphenyl)ethenyl]-4,6-bis(trichloromethyl)-1,3,5-triazine, 2-[2-(3-propoxy-5-methoxyphenyl)ethenyl]-4,6-bis(trichloromethyl)-1,3,5-triazine, 2-[2-(3-propoxy-5-ethoxyphenyl)ethenyl]-4,6-bis(trichloromethyl)-1,3,5-triazine, 2-[2-(3,5-dipropoxyphenyl)ethenyl]-4,6-bis(trichloromethyl)-1,3,5-triazine, 2-(3,4-methylenedioxyphenyl)-4,6-bis(trichloromethyl)-1,3,5-triazine, and 2-[2-(3,4-methylenedioxyphenyl)ethenyl]-4,6-bis(trichloromethyl)-1,3,5-triazine. These triazine compounds may be used either alone, or in combinations of two or more different compounds.

The above compounds may be used either alone, or in combinations of two or more different compounds.

Of the compounds exemplified above, the compound represented by the above formula (V) and the compound represented by the above formula (IX) are preferred as they exhibit particularly superior acid generating efficiency upon electron beam irradiation.

In the present invention, a combination of an aforementioned oxime sulfonate-based acid generator and an onium salt-based acid generator may also be used as the component (B).

Examples of suitable onium salt-based acid generators include compounds represented by general formulas (b-1) and (b-2) shown below,

[Formula 13]

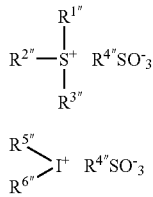

[wherein, $R^{1''}$ to $R^{3''}$, and $R^{5''}$ to $R^{6''}$ each represent, independently, an aryl group or an alkyl group; and $R^{4''}$ represents a straight-chain, branched or cyclic alkyl group or fluoroalkyl group; provided that at least one of $R^{1''}$ to $R^{3''}$ represents an aryl group, and at least one of $R^{5''}$ to $R^{6''}$ represents an aryl group]

In the formula (b-1), $R^{1''}$ to $R^{3''}$ each represent, independently, an aryl group or an alkyl group. Of the groups $R^{1''}$ to $R^{3''}$, at least one group represents an aryl group. Compounds in which at least two of $R^{1''}$ to $R^{3''}$ represent aryl groups are preferred, and compounds in which all of $R^{1''}$ to $R^{3''}$ are aryl groups are the most preferred.

There are no particular restrictions on the aryl groups of $R^{1''}$ to $R^{3''}$, and suitable examples include aryl groups of 6 to 20 carbon atoms, in which either a portion of, or all of, the hydrogen atoms of these aryl groups may be either substituted, or not substituted, with alkyl groups, alkoxy groups, or halogen atoms and the like. In terms of enabling low-cost synthesis, aryl groups of 6 to 10 carbon atoms are preferred. Specific examples of suitable groups include a phenyl group and a naphthyl group.

Alkyl groups that may be used for substitution of the hydrogen atoms of the above aryl groups are preferably alkyl groups of 1 to 5 carbon atoms, and a methyl group, ethyl group, propyl group, n-butyl group or tert-butyl group is the most desirable.

Alkoxy groups that may be used for substitution of the hydrogen atoms of the above aryl groups are preferably alkoxy groups of 1 to 5 carbon atoms, and a methoxy group or ethoxy group is the most desirable.

Halogen atoms that may be used for substitution of the hydrogen atoms of the above aryl groups are preferably fluorine atoms.

There are no particular restrictions on the alkyl groups of $R^{1''}$ to $R^{3''}$, and suitable examples include straight-chain, branched, or cyclic alkyl groups of 1 to 10 carbon atoms. From the viewpoint of achieving excellent resolution, alkyl groups of 1 to 5 carbon atoms are preferred. Specific examples include a methyl group, ethyl group, n-propyl group, isopropyl group, n-butyl group, isobutyl group, n-pentyl group, cyclopentyl group, hexyl group, cyclohexyl group, nonyl group, and decanyl group, although in terms of achieving superior resolution and enabling low-cost synthesis, a methyl group is the most desirable.

Of the above possibilities, compounds in which $R^{1''}$ to $R^{3''}$ are all phenyl groups are the most preferred.

The group $R^{4''}$ represents a straight-chain, branched or cyclic alkyl group or fluoroalkyl group.

As the straight-chain or branched alkyl group, groups of 1 to 10 carbon atoms are preferred, groups of 1 to 8 carbon atoms are even more preferred, and groups of 1 to 4 carbon atoms are the most desirable.

Suitable cyclic alkyl groups include the same groups as those listed above in relation to the group $R^{1"}$, and cyclic groups of 4 to 15 carbon atoms are preferred, groups of 4 to 10 carbon atoms are even more preferred, and groups of 6 to 10 carbon atoms are the most desirable.

As the above fluoroalkyl group, groups of 1 to 10 carbon atoms are preferred, groups of 1 to 8 carbon atoms are even more preferred, and groups of 1 to 4 carbon atoms are the most desirable. Furthermore, the fluorination ratio of the fluoroalkyl group (namely, the fluorine atom proportion within the alkyl group) is preferably within a range from 10 to 100%, and even more preferably from 50 to 100%, and groups in which all of the hydrogen atoms have been substituted with fluorine atoms yield the strongest acids, and are consequently the most desirable.

The group $R^{4"}$ is most preferably a straight-chain or cyclic alkyl group, or a fluoroalkyl group.

In the formula (b-2), $R^{5"}$ to $R^{6"}$ each represent, independently, an aryl group or an alkyl group. At least one of $R^{5"}$ to $R^{6"}$ represents an aryl group. Compounds in which all of $R^{5"}$ to $R^{6"}$ are aryl groups are the most preferred.

Suitable examples of the aryl groups of the groups $R^{5"}$ to $R^{6"}$ include the same aryl groups as those described above for the groups $R^{1"}$ to $R^{3"}$.

Suitable examples of the alkyl groups of the groups $R^{5"}$ to $R^{6"}$ include the same alkyl groups as those described above for the groups $R^{1"}$ to $R^{3"}$.

Of the above possibilities, compounds in which $R^{5"}$ to $R^{6"}$ are all phenyl groups are the most preferred.

Suitable examples of the group $R^{4"}$ in the formula (b-2) include the same groups as those described for the group $R^{4"}$ in the aforementioned formula (b-1).

Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, and diphenyl(1-(4-methoxy)naphthyl)sulfonium trifluoromethanesulfonate, heptafluoropropanesulfonate or nonafluorobutanesulfonate. Furthermore, onium salts in which the anion portion of the above onium salts have been substituted with methanesulfonate, n-propanesulfonate, n-butanesulfonate, or n-octanesulfonate can also be used.

Compounds in which the anion portion within the above general formulas (b-1) and (b-2) has been substituted with an anion portion represented by a general formula (b-3) or (b-4) shown below (and in which the cation portion is the same as that shown in (b-1) or (b-2)) can also be used.

[Formula 14]

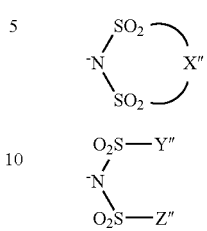

[wherein, X" represents an alkylene group of 2 to 6 carbon atoms in which at least one hydrogen atom has been substituted with a fluorine atom; Y" and Z" each represent, independently, an alkyl group of 1 to 10 carbon atoms in which at least one hydrogen atom has been substituted with a fluorine atom]

The group X" is a straight-chain or branched alkylene group in which at least one hydrogen atom has been substituted with a fluorine atom, and the number of carbon atoms within the alkylene group is typically within a range from 2 to 6, preferably from 3 to 5, and is most preferably 3.

Y" and Z" each represent, independently, a straight-chain or branched alkyl group in which at least one hydrogen atom has been substituted with a fluorine atom, and the number of carbon atoms within the alkyl group is typically within a range from 1 to 10, preferably from 1 to 7, and is most preferably from 1 to 3.

Within the above ranges for the numbers of carbon atoms, lower numbers of carbon atoms within the alkylene group X" or the alkyl groups Y" and Z" result in better solubility within the resist solvent, and are consequently preferred.

Furthermore, in the alkylene group X" or the alkyl groups Y" and Z", the larger the number of hydrogen atoms that have been substituted with fluorine atoms, the stronger the acid becomes, and the transparency relative to high energy light beams of 200 nm or less or electron beams also improves favorably. The fluorine atom proportion within the alkylene group or alkyl groups, namely the fluorination ratio, is preferably within a range from 70 to 100%, and even more preferably from 90 to 100%, and perfluoroalkylene or perfluoroalkyl groups in which all of the hydrogen atoms have been substituted with fluorine atoms are the most desirable.

These compounds may be used either alone, or in combinations of two or more different compounds.

The blend quantity of the component (B) is preferably within a range from 1 to 30 parts by weight, and even more preferably from 1 to 20 parts by weight, per 100 parts by weight of the component (A).

Optional Components

In the positive resist composition according to the first aspect of the present invention, in order to improve the resist pattern shape and the post exposure stability of the latent image formed by the pattern-wise exposure of the resist layer, a nitrogen-containing organic compound (D) (hereafter referred to as the component (D)) is preferably added to the composition.

There are no particular restrictions on the compound (D) provided it exhibits compatibility with the other components of the positive resist composition, and suitable compounds include those disclosed in Japanese Unexamined Patent Application, First Publication No. Hei 9-6001.

In particular, by adding a comparatively bulky specific basic compound (d1) represented by a general formula (X) shown below, the quantity of acid components produced as by-products during storage of the positive resist composition can be reduced, enabling the long-term storage stability of the positive resist composition to be improved.

[Formula 15]

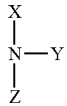
(X)

In the general formula (X), at least one (and preferably 2 or more, and most preferably all three) of X, Y and Z represents one or more groups selected from the group consisting of (1) straight-chain or branched-chain alkyl groups containing 4 or more carbon atoms, (2) cyclic alkyl groups containing 3 or more carbon atoms, (3) a phenyl group, and (4) aralkyl groups.

In an alkyl group (1) containing 4 or more carbon atoms, ensuring that the number of carbon atoms is at least 4 is effective in improving the stability over time. The number of carbon atoms is even more preferably 5 or greater, and is most preferably 8 or greater. There are no particular restrictions on the upper limit for the number of carbon atoms, although in terms of achieving a favorable stability effect and ensuring ready commercial availability, the number of carbon atoms is preferably no greater than 20, and even more preferably no greater than 15. If the number of carbon atoms exceeds 20, then the strength of the base may weaken, making the desired storage stability effect unobtainable.

The alkyl group (1) may be either a straight-chain or branched-chain group. Straight-chain groups are particularly preferred, and specific examples include an n-decyl group, n-octyl group, and n-pentyl group.

Of the cyclic alkyl groups (2) containing 3 or more carbon atoms, cycloalkyl groups of 4 to 8 carbon atoms are preferred as they are readily available commercially and produce a favorable improvement in the stability of the composition over time. A cyclohexyl group containing 6 carbon atoms is particularly desirable.

An aralkyl group (4) is a group in which one hydrogen atom has been removed from the side chain of an aromatic hydrocarbon containing a side chain, and can be represented by a general formula —R'—P (wherein, R' represents an alkylene group and P represents an aryl group). Examples of the aryl group represented by P include a phenyl group or naphthyl group, although a phenyl group is preferred. The alkylene group represented by R' may be any group containing 1 or more carbon atoms, although groups containing 1 to 3 carbon atoms are preferred.

The aralkyl group (4) is preferably a benzyl group or phenylethyl group.

Either one or two of the groups X, Y and Z may be groups or atoms other than the groups (1) to (4) described above. These groups or atoms other than the groups (1) to (4) are preferably selected from the group consisting of (1') straight-chain or branched-chain alkyl groups containing no more than 3 carbon atoms, and (2') a hydrogen atom.

The alkyl group (1') containing no more than 3 carbon atoms may be either a straight-chain or branched-chain group. A methyl group or ethyl group is preferred.

X, Y and Z may be the same, or may represent mutually different groups, although when two or more of X, Y and Z represent groups selected from (1) to (4) above, these two or more groups are preferably identical, as such compounds yield more stable effects.

As the basic compound (d1), tertiary amines are preferred, and those groups amongst X, Y and Z that are not represented by (1) to (4) are preferably selected from (1') above.

Specific examples of suitable compounds include tri-n-decylamine, methyl-di-n-octylamine, tri-n-pentylamine, N,N-dicyclohexylmethylamine, and tribenzylamine.

Of these, one or more compounds selected from amongst tri-n-decylamine, methyl-di-n-octylamine, and tri-n-pentylamine are preferred, and tri-n-decylamine is particularly desirable.

Pyridine-based compounds can also be used as the component (D). In particular, 2,6-lutidine offers superior post exposure stability of the latent image formed by the pattern-wise exposure of the resist layer, and is consequently preferred.

As the component (D), either a single compound may be used alone, or a mixture of two or more different compounds may be used.

The component (D) is typically used in a quantity within a range from 0.01 to 5.0 parts by weight per 100 parts by weight of the component (A).

Furthermore, in order to prevent any deterioration in sensitivity caused by the addition of the above component (D), and improve the resist pattern shape and the post exposure stability of the latent image formed by the pattern-wise exposure of the resist layer, an organic carboxylic acid, or a phosphorus oxo acid or derivative thereof (E) (hereafter referred to as the component (E)) may also be added to the positive resist composition as another optional component. The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Adding a storage stabilizer to the positive resist composition according to the first aspect of the present invention enables the type of organic solvent decomposition reactions described below to be suppressed, and is consequently preferred.

There are no particular restrictions on the storage stabilizer, provided it has the effect of suppressing decomposition reactions of the organic solvent, and suitable compounds include the antioxidants disclosed in Japanese Unexamined Patent Application, First Publication No. Sho 58-194834. Phenol-based compounds and amine-based compounds are widely known as antioxidants, and of these, phenol-based compounds are preferred, and 2,6-di(tert-butyl)-p-cresol and derivatives thereof are particularly effective in suppressing the degradation of ester-based solvents and ketone-based solvents, are readily available commercially at low cost, and exhibit a superior storage stability effect, and are consequently preferred. These antioxidants display a particularly superior degradation prevention effect for propylene glycol monoalkyl ether acetates and 2-heptanone.

Other miscible additives can also be added to the positive resist composition of the first aspect of the present invention according to need, and examples include additive resins for improving the properties of the resist film, surfactants for improving the coating properties, dissolution inhibitors, plasticizers, colorants, halation prevention agents, and dyes.

The positive resist composition according to the first aspect of the present invention can be produced by dissolving the materials in an organic solvent.

The organic solvent may be any solvent capable of dissolving the various components used to generate a uniform solution, and one or more solvents selected from known materials used as the solvents for conventional chemically amplified resists can be used.

Specific examples of the solvent include lactones such as γ-butyrolactone; ketones such as acetone, methyl ethyl ketone, cyclohexanone, methyl isoamyl ketone and 2-heptanone;

polyhydric alcohols and derivatives thereof such as ethylene glycol, ethylene glycol monoacetate, diethylene glycol, diethylene glycol monoacetate, propylene glycol, propylene glycol monoacetate, dipropylene glycol or dipropylene glycol monoacetate, or the monomethyl ether, monoethyl ether, monopropyl ether, monobutyl ether or monophenyl ether of these polyhydric alcohols;

cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used either alone, or as a mixed solvent of two or more different solvents.

Furthermore, mixed solvents produced by mixing propylene glycol monomethyl ether acetate (PGMEA) with a polar solvent are preferred. Although the blend ratio (weight ratio) in such mixed solvents can be set in accordance with factors such as the co-solubility of the PGMEA and the polar solvent, the ratio is preferably within a range from 1:9 to 9:1, and is even more preferably from 2:8 to 8:2.

There are no particular restrictions on the quantity used of the organic solvent, although the quantity should be set in accordance with the coating film thickness required, at a concentration that enables favorable application of the solution to a substrate or the like, and typically, the quantity of solvent is set so that the solid fraction concentration of the resist composition falls within a range from 2 to 60% by weight, preferably from 5 to 50% by weight, and even more preferably from 5 to 40% by weight.

These organic solvents include some solvents that may decompose over time and generate acid by-products, although in the presence of the above component (D) or a storage stabilizer, the decomposition reaction can be suppressed. Of the organic solvents listed above, this suppression effect is particularly marked for ester-based solvents including PGMEA and esters such as butyl acetate. As a result, in the presence of an aforementioned component (D) and/or a storage stabilizer, the use of an ester-based solvent as the organic solvent is preferred, and PGMEA is particularly desirable.

In the case of 2-heptanone for example, acid components that have been confirmed as decomposition by-products include formic acid, acetic acid and propionic acid.

A positive resist composition according to the above first aspect of the present invention can be used for producing MEMS using an electron beam.

As described above, MEMS are highly advanced micro systems in which micromachining techniques are used to integrate a variety of microstructures (including functional elements such as sensors, and conductive structures such as wiring and connection terminals) on top of a substrate.

Specific examples of MEMS include magnetic heads for magnetic recording media, perpendicular magnetic heads, and MRAM [(Magnetic Random Access Memory): nonvolatile memory that uses a GMR (giant magnetoresistive) film or TMR (tunnel magnetoresistive) film with a magnetoresistive effect as a memory element].

In the production of these MEMS, in addition to lithography steps, steps for forming conductive structures such as wiring by using plating methods and the like are also conducted. Furthermore, a variety of other steps may also be conducted, including dry etching, ion implantation (hereafter referred to as an implant) in which impurities such as phosphorus or boron are ionized within a vacuum, and then accelerated by a strong electric field and driven into the surface of a substrate, and ion etching steps such as ion milling, and for example in the production of a magnetic head, ion etching of a magnetic film is conducted using a resist pattern.

In these steps, the resist pattern is frequently subjected to heating, and consequently the positive resist composition according to the first aspect of the present invention, which enables the formation of a high-resolution resist pattern with excellent plating resistance and heat resistance, is ideal for MEMS production.

Furthermore, the positive resist composition according to the first aspect of the present invention also exhibits favorable dry etching resistance, implant resistance and ion etching resistance, as well as superior adhesion to substrates, and these properties also make the composition ideal for MEMS production.

The step of forming a conductive structure on a substrate by a plating method can be completed, for example, by forming a resist film on the upper surface of the substrate, forming a resist pattern using a method such as that described below, subsequently embedding a conductive material within the removed portions of the resist (the resist-free portions) by using a plating method, and then finally removing the surrounding resist pattern.

Examples of conductive structures that can be formed by plating include connection terminals such as bumps, leads, metal posts and solder balls, as well as wiring and rewiring. Furthermore, examples of suitable conductive materials include gold, copper, nickel and solder.

There are no particular restrictions on the plating method, and any of the various conventional plating methods can be employed.

<Method for Forming Resist Pattern According to the Second Aspect>

The method for forming a resist pattern according to the second aspect of the present invention can be conducted, for example, in the manner described below.

Namely, the aforementioned positive resist composition according to the first aspect of the present invention is first applied to a substrate such as a silicon wafer using a spinner or the like, and a prebake is then conducted under temperature conditions of 60 to 180° C., for a period of 10 to 600 seconds, and preferably for 60 to 90 seconds, thereby forming a resist film. There are no particular restrictions on the film thickness of the resist film. However, the resist film preferably has a thickness within a range from 100 nm to 10 µm, and even more preferably from 200 nm to 5 µm.

The resist film is then subjected to selective exposure with an electron beam using an electron beam lithography apparatus, either by exposure through a desired mask pattern, or by direct patterning without using a mask. Following this exposure via a mask pattern, or patterning conducted by direct irradiation with the electron beam without using a mask pattern, a heat treatment (post exposure baking (PEB)) is conducted under temperature conditions of 80 to 150° C., for a period of 40 to 120 seconds, and preferably for 60 to 90 seconds. Subsequently, developing is conducted using an alkali developing liquid such as a 0.1 to 10% by weight aqueous solution of tetramethylammonium hydroxide (TMAH), thereby forming a resist pattern.

An organic or inorganic anti-reflective film may also be provided between the substrate and the applied layer of the resist composition.

This method for forming a resist pattern can be used favorably within a MEMS production process described below.

As follows is a description of one example of a MEMS production process using the present invention, with reference to FIG. 1A through FIG. 2C.

FIG. 1A through FIG. 1E are schematic illustrations (side sectional views) showing each of the steps in the production of the read portion (the head portion used for reading) of the magnetic head of a magnetic recording medium.

First, as shown in FIG. 1A, a magnetic film 2' is laminated on top of a substrate 1, and a base film 3' that is soluble in alkali developing solution, and a resist film 4' are then laminated sequentially on top of the magnetic film 2'.

Figure 1B:
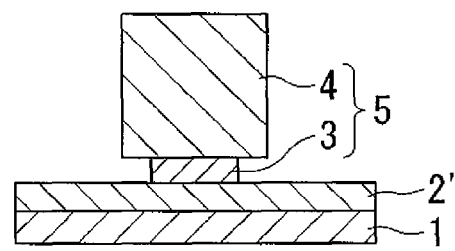
FIG. 1B is a schematic illustration describing a step of forming a magnetic film pattern by ion etching using a resist pattern as a mask.

Subsequently, selective irradiation is conducted through a mask pattern from above the resist film 4', using an electron beam or the like. Alkali developing is then conducted, thereby etching certain areas of the resist film 4' (the exposed portions in the case of a positive resist, or the unexposed portions in the case of a negative resist) and generating a resist pattern 4. At this point, the base film 3' positioned below those portions of the resist film 4' etched by the alkali developing is preferably also removed by the developing solution, forming a base pattern 3. Because the base film 3' typically has a higher level of alkali solubility than the resist film 4', the width $W^1$ of the base pattern 3 tends to be narrower than the width $W^2$ of the resist pattern 4. As a result of this difference in solubility, a lift-off pattern 5 with a paddle-shaped cross-section such as that shown in FIG. 1B is obtained, which includes a base pattern 3 of narrow width, and a resist pattern 4 of greater width.

Figure 1C:
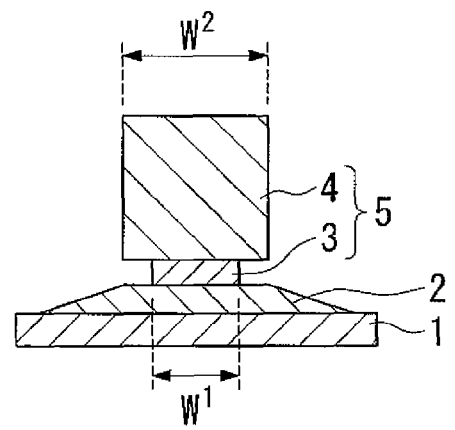
FIG. 1C is a schematic illustration describing a step of forming a magnetic film pattern by ion etching using a resist pattern as a mask.

When ion etching is then conducted using this pattern 5 as a mask, as shown in FIG. 1C, the magnetic film 2' surrounding the pattern 5 is etched away, forming a magnetic film pattern 2 beneath the pattern 5 and in the immediate vicinity thereof. Ion milling is typically used for the ion etching.

Figure 1D:
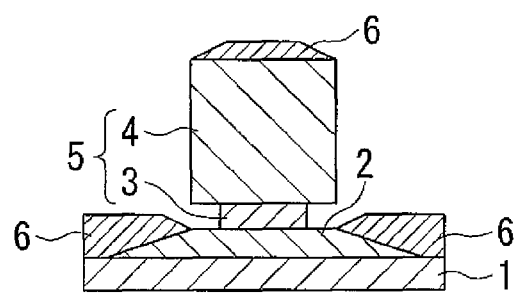
FIG. 1D is a schematic illustration describing a step of forming a magnetic film pattern by ion etching using a resist pattern as a mask.

When sputtering is then conducted, an electrode film 6 is formed on top of the pattern 5, and on top of the substrate 1 around the periphery of the magnetic film pattern 2, as shown in FIG. 1D.

Finally, an alkali developing solution or the like is then used to dissolve the base pattern 3 and remove the resist pattern 4, thereby removing (lifting off) the pattern 5. By conducting this type of lift-off of the pattern 5, a magnetic head 10 such as that shown in FIG. 1E, including the substrate 1, the magnetic film pattern 2 of a predetermined width formed thereon, and the electrode film 6 formed around the periphery of the pattern 2, can be obtained.

As follows is a more detailed description of the processes shown in FIG. 1A to FIG. 1E.

(Magnetic Film 2' Formation Step)

First, as shown in FIG. 1A, a sputtering apparatus or the like is used to form the magnetic film 2' on top of the substrate 1 such as a silicon wafer.

There are no particular restrictions on the substrate, and conventional substrates can be used, including those substrates typically used for electronic componentry. Specific examples of the substrate material include a silicon wafer, metals such as copper, chrome, iron or aluminum, and glass.

Examples of the magnetic material used for the magnetic film 2' include materials that contain elements such as Ni, Co, Cr and Pt.

(Base Film 3' Formation Step)

Subsequently, a resist composition or resin solution for forming the base film is applied to the surface of the formed magnetic film 2' using a spinner or the like, and is then subjected to a baking treatment under heating conditions of 200 to 300° C. for a period of 30 to 300 seconds, and preferably for 60 to 180 seconds, thereby forming a base film 3'.

As the base film, an organic film that is insoluble in the alkali developing solution used during post-exposure developing and able to be etched using a conventional dry etching method may be used.

By using this type of base film 3', as described below, normal photolithography can be used to expose and develop solely the resist film 4', thereby forming the resist pattern 4, and by using this resist pattern 4 as a mask to conduct dry etching of the base film 3', the resist pattern 4 can be transferred to the base film 3', forming a base pattern 3 in the base film 3'.

The material used for forming the base film 39 need not necessarily exhibit the type of photosensitivity displayed by the resist film 4', and may use the types of resists or resins typically used as base materials within the production of semiconductor elements and liquid crystal display elements.

Furthermore, because the resist pattern 4 must be transferred to the base film 3', the base film 3' is preferably formed of a material that is able to be etched by oxygen plasma etching.

As this material, materials containing at least one resin selected from a group consisting of novolak resins, acrylic resins, and soluble polyimides as the primary component are preferred, as they are readily etched by oxygen plasma treatment, display good resistance to fluorocarbon-based gases, which are used in subsequent steps for tasks such as etching the silicon substrate, and also exhibit good resistance to dry etching, including ion etching such as ion milling, which is used during subsequent etching of the substrate or magnetic film.

As the novolak resin, any of the resins typically used in conventional resist compositions can be used, and resists for i-line or g-line radiation containing a novolak resin as the primary component can also be used. Examples of this novolak resin include the same resins as those exemplified above for the novolak resin (a) in the description of the component (A).

As the acrylic resin, any of the resins typically used in positive resist compositions can be used, and suitable examples include acrylic resins containing structural units derived from a polymerizable compound containing an ether linkage, and structural units derived from a polymerizable compound containing a carboxyl group.

Examples of the polymerizable compound containing an ether linkage include (meth)acrylic acid derivatives containing both an ether linkage and an ester linkage such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, and tetrahydrofurfuryl (meth)acrylate. These compounds may be used either alone, or in combinations of two or more different compounds. The term "(meth)acrylate" refers to either one of, or both, acrylate and methacrylate. The term "(meth)acrylic acid" refers to either one of, or both, acrylic acid and methacrylic acid. Furthermore, the term "(meth)acrylic acid derivative" refers to either one of, or both, an acrylic acid derivative and a methacrylic acid derivative.

Examples of the polymerizable compound containing a carboxyl group include monocarboxylic acids such as acrylic acid, methacrylic acid, and crotonic acid; dicarboxylic acids such as maleic acid, fumaric acid, and itaconic acid; and compounds containing both a carboxyl group and an ester linkage such as 2-methacryloyloxyethylsuccinic acid, 2-methacryloyloxyethylmaleic acid, 2-methacryloyloxyethylphthalic acid, and 2-methacryloyloxyethylhexahydrophthalic acid, although of these, acrylic acid and methacrylic acid are preferred. These compounds may be used either alone, or in combinations of two or more different compounds.

A soluble polyimide refers to a polyimide that can be converted to liquid form in the type of organic solvents described above.

Of the above possibilities, a novolak resin or an acrylic resin containing alicyclic portions or aromatic rings as side chains are preferred, as they are low-cost and widely available, and also exhibit excellent dry etching resistance in subsequent steps.

(Resist Film 4' Formation Step)

Subsequently, a solution of the positive resist composition according to the first aspect of the present invention is applied to the aforementioned base film 3' using a spinner or the like, and a prebake (PAB treatment) is then conducted to form the resist film 4', thus completing preparation of a laminate in which the magnetic film 2', the base film 3', and the resist film 4' formed from the positive resist composition of the first aspect of the present invention have been laminated on top of the substrate 1.

The prebake conditions vary depending on the nature of each of the components within the composition, their respective blend quantities, and the thickness of the applied film, but typically employ a temperature within a range from 70 to 150° C., and preferably from 80 to 140° C., for a period of 0.5 to 60 minutes.

An organic or inorganic anti-reflective film may also be provided between the base film 3' and the resist film 4'.

In this laminate, achieving a balance between the desired aspect ratio and the throughput, which takes the etching time of the base film 3' into consideration, the combined thickness of the base film 3' and the resist film 4' is preferably no more than 15 µm, and is even more preferably 5 µm or less. There are no particular restrictions on the lower limit for the total thickness, although the thickness is preferably at least 0.1 µm, and even more preferably 0.35 µm or greater.

The thickness of the base film 3' is preferably within a range from 20 to 10,000 nm, even more preferably from 30 to 5,000 nm, and is most preferably from 30 to 3,000 nm. By ensuring that the thickness of the base film 3' is within this range, a resist pattern with a high aspect ratio can be formed, and a satisfactory level of etching resistance can also be achieved during substrate etching.

The thickness of the resist film 4' is preferably within a range from 50 to 1,000 nm, even more preferably from 100 to 800 nm, and is most preferably from 100 to 500 nm. By ensuring that the thickness of the resist film 4' is within this range, the resist pattern 4 can be formed at high resolution, and satisfactory levels of resistance can be achieved to the alkali developing solution and etching such as ion etching.

In a resist laminate in which a resist pattern has been formed, a high aspect ratio pattern is preferably able to be formed without any pattern collapse. The higher the aspect ratio of the pattern becomes, the more precisely a fine pattern is able to formed within the type of support described below.

In this description, the term aspect ratio refers to the ratio of the height y of the lower base pattern 3 relative to the pattern width x of the resist pattern (namely, y/x). The pattern width x of the resist pattern is either the same as the width of the base pattern 3 following transfer of the pattern to the base pattern 3, or in the case of over-etching of the base film, the pattern width x of the resist pattern is greater than the width of the base pattern 3.

In those cases where the resist pattern is a line-shaped pattern such as a line and space pattern or an isolated line pattern, the pattern width refers to the width of a raised portion (a line). In those cases where the resist pattern is a hole pattern, the pattern width refers to the inner diameter of a formed hole. Furthermore, in those cases where the resist pattern is a circular dot pattern, the pattern width is the diameter of a dot. These pattern widths all refer to the widths at the bottom of the pattern.

(Resist Pattern Formation Step)

Subsequently, as described above in the section entitled <Method for Forming Resist Pattern>, the resist film 4' is subjected to selective exposure with an electron beam using an electron beam lithography apparatus, either by exposure through a desired mask pattern, or by direct patterning without using a mask, and by subsequently conducting PEB and a developing treatment, predetermined portions (the exposed portions) of the resist film 4' are developed, forming a resist pattern 4 as shown in FIG. 1B.

(Over-Etching Step)

Next, dry etching of the base film 3' is conducted using the obtained resist pattern 4 as a mask, thereby forming a base pattern 3 in the base film 3'.

By conducting over-etching of the base film 3', portions of the base film 3' positioned beneath the resist pattern 4 are also removed, meaning the base film 3' remains only in portions beneath the center of the resist pattern 4. As a result, as shown in FIG. 1B, a lift-off pattern 5 with a paddle-shaped cross-section such as that shown in FIG. 1B is obtained, which includes a base pattern 3 of a narrow width $W^1$ within the base film 3', and a resist pattern 4 of a greater width $W^2$ within the resist film 4'.

As the dry etching method, conventional methods including chemical etching such as down-flow etching or chemical dry etching; physical etching such as sputter etching or ion beam etching; or chemical-physical etching such as RIE (reactive ion etching) can be used.

The most typical type of dry etching is parallel plate RIE. In this method, first, the resist laminate is placed inside the RIE apparatus chamber, and the required etching gas is introduced into the chamber. The chamber is provided with an upper electrode and a resist laminate holder that is positioned parallel to this upper electrode. A high frequency voltage is applied the resist laminate holder positioned inside the chamber, causing the generation of a gas plasma. The plasma contains charged particles such as positive and negative ions and electrons, as well as electrically neutral active seeds. As these etching seeds adsorb to the lower organic layer (the base film 3'), a chemical reaction occurs, and the resulting reaction product breaks away from the surface and is discharged externally, causing the etching to proceed.

Examples of the etching gas include oxygen or sulfur dioxide or the like, although oxygen is preferred.

(Magnetic Film 2' Ion Etching Step)

Next, the pattern 5 obtained in the manner described above is used to produce the magnetic head read portion.

When ion etching is conducted using the pattern 5, which includes the taper-shaped resist pattern 4 and base pattern 3 shown in FIG. 1B, as a mask, then as shown in FIG. 1C, the magnetic film 2' surrounding the pattern 5 is etched away, thereby leaving the magnetic film 2' positioned beneath the pattern 5 and forming a magnetic film pattern 2.

Examples of the ion etching used during this process include anisotropic etching techniques such as ion milling. This ion milling can be conducted using conventional methods, using, for example, an IML series ion beam milling apparatus manufactured by Hitachi Ltd.

(Sputtering Step)

If sputtering is then conducted, then as shown in FIG. 1D, an electrode film 6 is formed on top of the pattern 5, and on top of the substrate 1 in the vicinity surrounding the magnetic film pattern 2.

This sputtering can be conducted using conventional methods. For example, an ISM-2200 or ISP-1801 sputtering apparatus manufactured by Hitachi Ltd. can be used.

(Lift-Off Step)

Figure 1E:
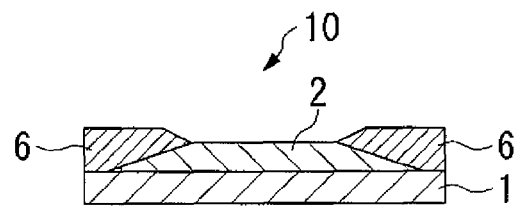
FIG. 1E is a schematic illustration describing a step of forming a magnetic film pattern by ion etching using a resist pattern as a mask.

Finally, by using etching to etch away the base pattern 3, thereby removing (lifting off) the pattern 5, a magnetic head read portion 10 such as that shown in FIG. 1E, including the substrate 1, the magnetic film pattern 2 formed thereon, and the electrode film 6 formed surrounding the pattern 2, is produced.

Figure 2A:
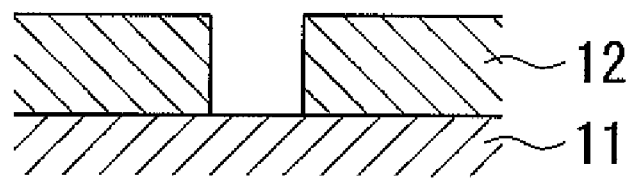
FIG. 2A is a schematic illustration describing a step of forming a magnetic film pattern by a plating method that uses a resist pattern as a frame.
Figure 2B:
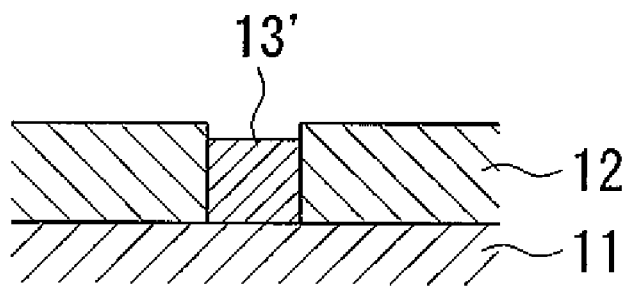
FIG. 2B is a schematic illustration describing a step of forming a magnetic film pattern by a plating method that uses a resist pattern as a frame.
Figure 2C:
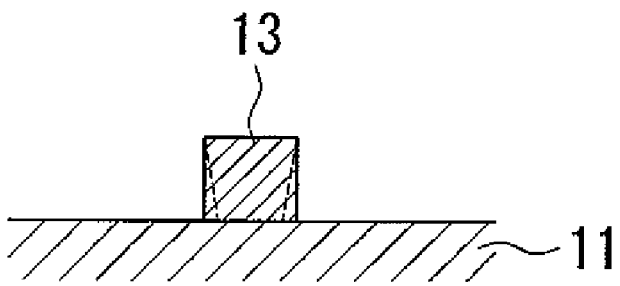
FIG. 2C is a schematic illustration describing a step of forming a magnetic film pattern by a plating method that uses a resist pattern as a frame.

Next is a description of a process for producing the write section (the head portion used for writing) of the magnetic head of a magnetic recording medium, with reference to FIG. 2A to FIG. 2C. In this process, a technique is used in which a fine magnetic film pattern is formed by first forming a fine trench resist pattern, and then conducting plating using this resist pattern as a frame.

FIG. 2A to FIG. 2C are schematic illustrations (side sectional views) showing each of the steps in the production of the write portion of a magnetic head.

First, as shown in FIG. 2A, a plating sheet layer 11 is formed on the upper surface of a base material prepared by forming a desired laminate structure on top of a substrate (not shown in the drawings), and conventional lithography such as that described above is then used to form a slit-shaped resist pattern 12 with a substantially rectangular cross section on top of the plating sheet layer 11.

Next, as shown in FIG. 2B, plating is conducted within the trench portions (recessed portions) surrounded by the formed resist pattern 12, thereby forming a magnetic film 13'.

Subsequently, as shown in FIG. 2C, the resist pattern 12 is removed, yielding a magnetic film pattern 13 in which the cross-sectional shape is either substantially rectangular, or a trapezoidal (reverse taper) shape with the width of the pattern gradually narrowing closer to the substrate.

The above description presented the example of a process for producing a magnetic head, in which the magnetic film 2 was laminated on top of the substrate 1, but the present invention is not restricted to this configuration, and the positive resist composition according to the first aspect of the present invention can be used in all manner of MEMS production processes, including those in which a magnetic film is not provided, such as the production of MRAM or the like.

As described above, according to the positive resist composition of the first aspect of the present invention and the method for forming a resist pattern according to the second aspect, a high-resolution resist pattern can be formed using an electron beam, and the formed resist pattern exhibits excellent plating resistance and heat resistance. As a result, the positive resist composition of the first aspect of the present invention and the method for forming a resist pattern of the second aspect are ideal for producing MEMS using an electron beam.

Furthermore, because the positive resist composition according to the first aspect of the present invention uses a novolak resin as the base for the component (A), the composition also exhibits favorable dry etching resistance, implant resistance and ion etching resistance, as well as superior adhesion to substrates. Furthermore, because the composition is chemically amplified, it exhibits a high degree of sensitivity to electron beams, and is able to improve the throughput within the production of MEMS using an electron beam.

Next is a description of the third and fourth aspects of the present invention.

<Positive Resist Composition of the Third Aspect>

A positive resist composition according to the third aspect of the present invention is a positive resist composition for use within an exposure step that uses at least two exposure light sources selected from amongst g-line radiation, i-line radiation, a KrF excimer laser and an electron beam, wherein the composition includes a resin component (A)' (hereafter referred to as the component (A)') that displays increased alkali solubility under the action of acid, and an acid generator component (B)' (hereafter referred to as the component (B)') that generates acid upon irradiation with g-line radiation, i-line radiation, a KrF excimer laser or an electron beam.

Component (B)'

As the component (B)', any compound that generates acid upon irradiation with g-line radiation, i-line radiation, a KrF excimer laser or an electron beam is suitable, and suitable compounds can be selected from amongst the various conventional acid generators proposed for use with chemically amplified resists.

The expression "generates acid upon irradiation with g-line radiation, i-line radiation, a KrF excimer laser or an electron beam" means that acid is generated regardless of which of these radiation sources is used as the exposure source.

A judgment as to whether or not a component (B)' is an acid generator that generates acid upon irradiation with g-line radiation, i-line radiation, a KrF excimer laser or an electron beam can be made, for example, by preparing a positive resist composition containing the component (B)' and a component (A)', using this positive resist composition to form a series of resist films, exposing these resist films with g-line radiation, i-line radiation, a KrF excimer laser and an electron beam respectively, conducting subsequent developing, and then ascertaining whether or not a resist pattern has been formed in each case.

Examples of acid generators that have been proposed for use with chemically amplified resists are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzyl sulfonate-based acid generators; iminosulfonate-based acid generators, and disulfone-based acid generators.

Of these, oxime sulfonate-based acid generators are preferred as they exhibit excellent transparency relative to g-line radiation, i-line radiation, and KrF excimer laser light, such that even if a thick resist film with a film thickness within a range from 300 nm to 5.0 μm is formed, the exposure light is still able to pass favorably through the resist film, enabling the formation of a high-resolution resist pattern.

Here, in the same manner as the first aspect, an oxime sulfonate-based acid generator refers to either a compound that contains at least one group represented by the general formula (B-1) shown above, or a compound represented by the general formula (III) or (IV) shown above, wherein the compound generates acid upon irradiation.

As the oxime sulfonate-based acid generator, a compound represented by the general formula (III) or (IV) shown above (see U.S. Pat. No. 6,004,724) exhibits a particularly high acid generating efficiency relative to irradiation with g-line radiation, i-line radiation, a KrF excimer laser or an electron beam, and is consequently ideal.

Of these compounds, a thiolene-containing oxime sulfonate represented by the formula (V) shown above is preferred.

Furthermore, besides these compounds and in the same manner as the first aspect, further examples of suitable compounds for the component (B)' include triazine compounds (VI) [bis(trichloromethyl)triazines] represented by the formula (VI) shown above, suitable combinations of this type of triazine compound (VI) and another triazine compound (VII) [a bis(trichloromethyl)triazine] represented by the formula (VII) shown above (see Japanese Unexamined Patent Application, First Publication No. Hei 6-289614 and Japanese Unexamined Patent Application, First Publication No. Hei 7-134412), compounds represented by a formula (VIII) shown above, and the compound represented by the formula (IX) shown above.

Specific examples of the triazine compounds (VI) include the same triazine compounds (VI) as those exemplified in relation to the first aspect, and these triazine compounds may be used either alone, or in combinations of two or more different compounds.

Specific examples of the above triazine compounds (VII) that may be used in combination with the aforementioned triazine compound (VI) include the same triazine compounds (VII) as those exemplified above in relation to the first aspect, and these triazine compounds may be used either alone, or in combinations of two or more different compounds.

The above compounds may be used either alone, or in combinations of two or more different compounds.

Of the compounds exemplified above, the compound represented by the above formula (V) and the compound represented by the above formula (IX) are preferred as they exhibit particularly superior acid generating efficiency upon irradiation with g-line radiation, i-line radiation, a KrF excimer laser or an electron beam.

In the third aspect of the present invention, a combination of an aforementioned oxime sulfonate-based acid generator and an onium salt-based acid generator may also be used as the component (B)'.

Examples of the onium salt-based acid generator include the same compounds represented by the above general formulas (b-1) and (b-2) described in relation to the first aspect.

Specific examples of suitable onium salt-based acid generators include the same onium salt-based acid generators as those exemplified above in relation to the first aspect.

Furthermore, as was the case in the first aspect, in the third aspect, compounds in which the anion portion within the above general formulas (b-1) and (b-2) has been substituted with an anion portion represented by either of the aforementioned general formulas (b-3) and (b-4) (and in which the cation portion is the same as that shown in (b-1) or (b-2)) can also be used.

The blend quantity of the component (B)' is preferably within a range from 1 to 30 parts by weight, and even more preferably from 1 to 20 parts by weight, per 100 parts by weight of the component (A)'.

Component (A)'

The component (A)' contains acid-dissociable, dissolution-inhibiting groups, and displays increased alkali solubility under the action of acid. When the acid generated from the component (B)' by exposure acts upon this component (A)', the entire component (A)' changes from an alkali-insoluble state to an alkali-soluble state. As a result, when a resist film formed from a positive resist composition containing the component (A)' and the component (B)' is either selectively exposed during the formation of a resist pattern, or alternatively is exposed and then subjected to post exposure baking, the exposed portions of the resist shift to an alkali-soluble state, whereas the unexposed portions remain insoluble in alkali, meaning alkali developing can then be used to form a positive resist pattern.

The acid-dissociable, dissolution-inhibiting groups within the component (A)' may be any group that dissociates in the presence of the acid generated from the component (B)' described above, and specific examples of suitable groups include the same acid-dissociable, dissolution-inhibiting groups as those exemplified above in relation to the first aspect.

As the resin component that contains these acid-dissociable, dissolution-inhibiting groups, any of those resins proposed as the base resin for use within conventional chemically amplified positive resist compositions can be used. Examples of these resins include resins in which a portion of the hydroxyl groups of a polyhydroxystyrene (PHS) based resin have been protected with acid-dissociable, dissolution-inhibiting groups. By using this type of resin, a high-resolution resist pattern can be formed. Furthermore, because microfabrication is possible even when a thick film is formed, a pattern with a high aspect ratio can be formed, meaning the resistance to dry etching can be improved.

Here, the term PHS-based resin describes resins that contain structural units derived from hydroxystyrene within the main chain, and refers specifically to polyhydroxystyrenes and hydroxystyrene-styrene copolymers.

In the present invention, as the component (A)', a similar resin to the first aspect in which a portion of all the hydroxyl groups within an alkali-soluble novolak resin have been protected with acid-dissociable, dissolution-inhibiting groups (hereafter also referred to as the component (A)) is preferred as such resins exhibit superior dry etching resistance, heat resistance, implant resistance, resistance to ion etching such as ion milling, adhesion to substrates, and plating resistance, and can be used in all manner of applications.

There are no particular restrictions on the unprotected alkali-soluble novolak resin (hereafter also referred to as the novolak resin (a)) in which none of the hydroxyl groups have been protected with acid-dissociable, dissolution-inhibiting groups, and this resin may be selected appropriately from amongst the resins typically used as the film-forming material within conventional positive resist compositions, although preferred resins include the same novolak resins as those described in relation to the first aspect, produced by a condensation reaction between an aromatic hydroxy compound, and an aldehyde and/or ketone.

Specific examples of aromatic hydroxy compounds that can be used in the synthesis of the novolak resin (a) include the same aromatic hydroxy compounds as those exemplified above in relation to the first aspect. These compounds may be used either alone, or in combinations of two or more different compounds.

Specific examples of aldehydes that can be used in the synthesis of the novolak resin (a) include the same aldehydes as those exemplified above in relation to the first aspect. These compounds may be used either alone, or in combinations of two or more different compounds.

Of these aldehydes, in terms of availability, the use of formaldehyde is preferred. The use of a combination of formaldehyde with a hydroxybenzaldehyde such as o-hydroxybenzaldehyde, m-hydroxybenzaldehyde or p-hydroxybenzaldehyde is particularly preferred as it yields superior heat resistance.

Specific examples of ketones that can be used in the synthesis of the novolak resin (a) include the same ketones as those exemplified above in relation to the first aspect. These compounds may be used either alone, or in combinations of two or more different compounds.

Furthermore, a suitable combination of an aforementioned aldehyde and a ketone may also be used.

In a similar manner to the first aspect, the novolak resin (a) can be produced by subjecting the aromatic hydroxy compound and the aldehyde and/or ketone to a conventional condensation reaction in the presence of an acid catalyst.

The weight average molecular weight (Mw) (the polystyrene equivalent value determined by gel permeation chromatography (GPC)) of the novolak resin (a), namely, the Mw value of the component (A)' prior to protection with the acid-dissociable, dissolution-inhibiting groups, is preferably within a range from 2,000 to 50,000, even more preferably from 3,000 to 20,000, and is most preferably from 4,000 to 15,000. Provided this Mw value is at least 2,000, favorable coating properties are obtained when the positive resist composition is dissolved in an organic solvent and applied to a substrate, whereas provided the Mw value is no greater than 50,000, favorable resolution is obtained.

In the third aspect of the present invention, as was the case in the first aspect, the novolak resin (a) is preferably subjected to a treatment for separating and removing low molecular weight materials prior to protection with the acid-dissociable, dissolution-inhibiting groups. This treatment further improves the heat resistance.

The yield from this low molecular weight material separation and removal treatment is preferably within a range from 50 to 95% by weight. Provided the yield is at least 50% by weight, the solubility of the resulting resin in an aqueous alkali solution can be satisfactorily increased under the action of the acid generated from the component (B)' described above. Accordingly, a large difference in the solubility rate can be achieved between the exposed portions and the unexposed portions, meaning a favorable resolution can be achieved. Furthermore, provided the yield is no greater than 95% by weight, the effect achieved by conducting the separation and removal manifests favorably.

Furthermore, the quantity of low molecular weight materials with a Mw value of 500 or less, as determined from a GPC chart, is typically no more than 15%, and is even more preferably 12% or less. By ensuring this quantity is no more than 15%, a favorable improvement in the heat resistance of the resist pattern can be achieved, and the quantity of sublimates produced during heat treatment can be suppressed.

The component (A) is a resin prepared by protecting a portion of all the hydroxyl groups within the novolak resin (a) with acid-dissociable, dissolution-inhibiting groups. Protecting a portion of all the hydroxyl groups within the novolak resin (a) with acid-dissociable, dissolution-inhibiting groups causes the resin to be either sparingly soluble or insoluble in alkali, and when the acid-dissociable, dissolution-inhibiting groups dissociate under the action of acid, the resin changes to an alkali-soluble state.

The component (A) can be obtained by reacting the above novolak resin (a) with the compound that corresponds with the aforementioned acid-dissociable, dissolution-inhibiting group.

In the third aspect of the present invention, as was the case in the first aspect, the component (A) is preferably the reaction product of a novolak resin (a) and a compound represented by the general formula (I) shown above (hereafter also referred to as the compound (I)), as such resins offer particularly superior effects for the present invention.

In a similar manner to the first aspect, when the novolak resin (a) is reacted with the compound (I), at least one of the two vinyl groups at the terminals of the compound (I) reacts with a hydroxyl group of the novolak resin (a), for example, with a side-chain phenolic hydroxyl group, thereby forming a reaction product.

The reaction product contains at least one of either structural units formed when one of the two vinyl groups at the terminals of the compound (I) bonds to a hydroxyl group within the novolak resin (a), and/or structural units formed when both of the two vinyl groups at the terminals of the compound (I) bond to hydroxyl groups within the novolak resin (a).

Here, the term "structural unit" refers to a monomer unit that contributes to formation of the resin (polymer).

Specifically, in the case where one of the two vinyl groups at the terminals of the compound (I) bonds to a single side-chain phenolic hydroxyl group within the novolak resin (a), a structural unit (1A) represented by the formula (1A) shown above is formed. Furthermore, when the two vinyl groups at the terminals of the compound (I) bond to two side-chain phenolic hydroxyl group within the novolak resin (a), an intermolecular cross-link is formed, forming a structural unit (1B) represented by the formula (1B) shown above.

Normally, a reaction product is obtained that includes both structural units in which only one terminal of the compound (I) has been bonded (such as the structural unit (1A)), and structural units in which both of the terminals have been bonded (such as the structural unit (1B)).

As described above, either one of, or both, the two vinyl groups at the terminals of the compound (I) react with a hydroxyl group within the novolak resin (a), such as a side-chain phenolic hydroxyl group, and the monovalent or bivalent group formed as a result of the cleavage of the vinyl group double bond functions as an acid-dissociable, dissolution-inhibiting group. In other words, because the compound (I) reacts with hydroxyl groups within the novolak resin (a), the resulting reaction product exhibits poorer solubility in aqueous alkali solutions than the novolak resin (a). Furthermore, when a positive resist composition containing this reaction product is applied to a substrate and subsequently heated, the unprotected hydroxyl groups within the reaction product react with the terminal vinyl group of the above structural units (1A) to form cross-linked structures, and as a result, the solubility within aqueous alkali solutions decreases even more, meaning the composition is almost insoluble in the alkali developing liquid such as an aqueous alkali solution used during resist pattern formation. However, when acid is generated from the component (B)' by exposure, the acid acts on the cross-linked structures, cleaving the bond between the oxygen atom derived from the hydroxyl group of the novolak resin (a), and the carbon atom bonded to that oxygen atom and derived from the vinyl group of the compound (I), thereby causing the solubility of the positive resist composition in the aqueous alkali solution to increase.

Furthermore, the cross-linked structures dissociate more readily than the acid-dissociable, dissolution-inhibiting groups described above. As a result, although the oxime sulfonate-based acid generator that is ideal as the component (B)' within a positive resist composition according to the third aspect of the present invention used within a mix and match method generates a much weaker acid than the strong acid generated by an onium salt-based acid generator, the dissociation reaction proceeds favorably even when this oxime sulfonate-based acid generator is used. As a result, the solubility contrast between the exposed portions and unexposed portions is large, enabling the formation of a higher resolution pattern.

Moreover, the formation of the above type of cross-linked structures increases the molecular weight of the component (A)' to a value that is from 2 to 20 times greater than the molecular weight of the non-cross-linked component. Consequently, the heat resistance is improved, and even if the formed resist pattern is heated at a temperature of 150° C. or higher, pattern deformation caused by heat sag or the like does not occur, meaning the shape of the pattern is retained.

The reaction between the novolak resin (a) and the compound (I) can be conducted using normal methods, and for example, the reaction can be accelerated by heating the two reactants within a solvent.

The quantity used of the compound (I) is preferably within a range from 1 to 15 parts by weight, and even more preferably from 4 to 8 parts by weight, per 100 parts by weight of the novolak resin (a). Provided this quantity is at least 1 part by weight, thickness loss within the unexposed portions of the resist pattern is minimal, and the resist pattern contrast tends to be large, whereas provided the quantity is no greater than 15 parts by weight, the solubility of the compound within the developing liquid (the aqueous alkali solution) is favorable, the sensitivity is excellent, and patterns are readily resolvable.

In the reaction between the novolak resin (a) and the compound (I), the reaction proceeds even without the use of an acid catalyst, meaning the use of an acid catalyst is not essential, and in actual fact, the presence of acid components such as an acid catalyst within the reaction system tends to be undesirable in terms of the storage stability of the following preparation of the resist composition. Acid components refer to acid catalysts used during the synthesis of the novolak resin (a), and organic acids such as free acid within the reaction solvent, and these acid components can be detected by gas chromatography or the like.

Normal methods can be used for removing such acid components, and suitable methods include the use of ion exchange resins, washing with pure water, and neutralization using an alkali.

Prior to reaction with the compound (I), the concentration of acid components within the novolak resin (a) is preferably no greater than 0.1 ppm, and is even more preferably 0.01 ppm or less.

In the component (A), the proportion of hydroxyl groups protected by acid-dissociable, dissolution-inhibiting groups (the protection ratio), namely, the ratio (%) of the number of hydroxyl groups within the component (A) protected by acid-dissociable, dissolution-inhibiting groups relative to the total number of hydroxyl groups within the novolak resin (a) used as the precursor to the component (A), is preferably within a range from 1 to 30%, even more preferably from 3 to 20%, and is most preferably from 5 to 10%.

The protection ratio for the component (A) can be measured, for example, using proton NMR.

In the present invention, following the protection of the hydroxyl groups with the acid-dissociable, dissolution-inhibiting groups, the component (A) is preferably subjected to a treatment for separating and removing low molecular weight materials. This treatment further improves the heat resistance.

Factors such as the method used for separating and removing the low molecular weight materials, the yield from the low molecular weight material separation and removal method, and the quantity of low molecular weight materials with a Mw value of 500 or less, are as described above for the novolak resin (a).

The weight average molecular weight (Mw) of the component (A) is preferably within a range from 2,000 to 100,000. Provided the Mw value is at least 2,000, the heat resistance is favorable. Furthermore, the coating properties obtained when the positive resist composition is dissolved in an organic solvent and applied to a substrate are also favorable. On the other hand, provided the Mw value is no greater than 100,000, favorable resolution is obtained.

In those cases where the component (A) is not a reaction product of the novolak resin (a) and the compound (I), then in consideration of the resolution and heat resistance, the weight average molecular weight (Mw) of the component (A) is preferably within a range from 3,000 to 20,000, and even more preferably from 4,000 to 15,000.

If the component (A) is a reaction product of the novolak resin (a) and the compound (I), the weight average molecular weight (Mw) of the reaction product is preferably within a range from 10,000 to 100,000, and even more preferably from 20,000 to 60,000. By ensuring this Mw value is at least 10,000, the improvement in the heat resistance of the resist pattern can be enhanced.

Optional Components

In the positive resist composition according to the third aspect of the present invention, in order to improve the resist pattern shape and the post exposure stability of the latent image formed by the pattern-wise exposure of the resist layer, a nitrogen-containing organic compound (D) which includes the same nitrogen-containing organic compound in relation to the first aspect (hereafter referred to as the component (D)) is preferably added to the composition.

There are no particular restrictions on the compound (D) provided it exhibits compatibility with the other components of the positive resist composition, and suitable compounds include those disclosed in Japanese Unexamined Patent Application, First Publication No. Hei 9-6001.

In particular, and in a similar manner to the first aspect, by adding a comparatively bulky specific basic compound (d1) represented by the general formula (X) shown above, the quantity of acid components produced as by-products during storage of the positive resist composition can be reduced, enabling the long-term storage stability of the positive resist composition to be improved.

Pyridine-based compounds can also be used as the component (D). In particular, 2,6-lutidine offers superior post exposure stability of the latent image formed by the pattern-wise exposure of the resist layer, and is consequently preferred.

As the component (D), either a single compound may be used alone, or a mixture of two or more different compounds may be used.

The component (D) is typically used in a quantity within a range from 0.01 to 5.0 parts by weight per 100 parts by weight of the component (A)'.

Furthermore, in order to prevent any deterioration in sensitivity caused by the addition of the above component (D), and improve the resist pattern shape and the post exposure stability of the latent image formed by the pattern-wise exposure of the resist layer, the same organic carboxylic acids, or phosphorus oxo acids or derivatives thereof (E) (hereafter referred to as the component (E)) as those exemplified in relation to the first aspect may also be added to the positive resist composition according to the third aspect of the present invention as another optional component. The component (D) and the component (E) can be used in combination, or either one can also be used alone.

The component (E) is typically used in a quantity within a range from 0.01 to 5.0 parts by weight per 100 parts by weight of the component (A)'.

As described below, adding a storage stabilizer to the positive resist composition according to the third aspect of the present invention enables decomposition reactions of the organic solvent to be suppressed, and is consequently preferred.

There are no particular restrictions on the storage stabilizer, provided it has the effect of suppressing decomposition reactions of the organic solvent, and suitable compounds include the antioxidants disclosed in Japanese Unexamined Patent Application, First Publication No. Sho 58-194834. Specific examples of these antioxidants include the same compound as those exemplified in relation to the first aspect.

A dye may also be added to the positive resist composition according to the third aspect of the present invention.

In the present invention, the term "dye" refers to a material that absorbs at least one of the light sources amongst g-line radiation, i-line radiation and KrF excimer laser light used in a mix and match method, and including this type of dye enables the sensitivity of the composition to the g-line radiation, i-line radiation or KrF excimer laser to be controlled, thereby adjusting the sensitivity balance of the composition relative to the sensitivity the composition exhibits to one or more other light sources (such as an electron beam). Furthermore, the effects of standing waves generated by the g-line radiation, i-line radiation or KrF excimer laser can also be reduced, enabling a reduction in line edge roughness (LER), an improvement in the in-plane uniformity of the pattern dimensions, and an improvement in the depth of focus.

Other miscible additives can also be added to the positive resist composition of the third aspect of the present invention according to need, and examples include additive resins for improving the properties of the resist film, surfactants for improving the coating properties, dissolution inhibitors, plasticizers, colorants, and halation prevention agents.

The positive resist composition according to the third aspect of the present invention can be produced by dissolving the materials in an organic solvent.

The organic solvent may be any solvent capable of dissolving the various components used to generate a uniform solution, and one or more solvents selected from known materials used as the solvents for conventional chemically amplified resists can be used.

Specific examples of these organic solvents include the same organic solvents a those exemplified above in relation to the first aspect.

These organic solvents may be used either alone, or as a mixed solvent of two or more different solvents.

Furthermore, mixed solvents produced by mixing propylene glycol monomethyl ether acetate (PGMEA) with a polar solvent are preferred. Although the blend ratio (weight ratio) in such mixed solvents can be set in accordance with factors such as the co-solubility of the PGMEA and the polar solvent, the ratio is preferably within a range from 1:9 to 9:1, and is even more preferably from 2:8 to 8:2.

There are no particular restrictions on the quantity used of the organic solvent, although the quantity should be set in accordance with the coating film thickness required, at a concentration that enables favorable application of the solution to a substrate or the like, and typically, the quantity of solvent is set so that the solid fraction concentration of the resist composition falls within a range from 2 to 60% by weight, preferably from 5 to 50% by weight, and even more preferably from 5 to 40% by weight.

These organic solvents include some solvents that may decompose over time and generate acid by-products, although in the presence of the above component (D) or an aforementioned storage stabilizer, the decomposition reaction can be suppressed. Of the organic solvents listed above, this suppression effect is particularly marked for ester-based solvents including PGMEA and esters such as butyl acetate. As a result, in the presence of an aforementioned component (D) and/or a storage stabilizer, the use of an ester-based solvent as the organic solvent is preferred, and PGMEA is particularly desirable.

In the case of 2-heptanone for example, acid components that have been confirmed as decomposition by-products include formic acid, acetic acid and propionic acid.

The positive resist composition according to the third aspect of the present invention can be used within an exposure step that uses at least two exposure light sources selected from amongst g-line radiation, i-line radiation, a KrF excimer laser and an electron beam.

Because the positive resist composition according to the third aspect of the present invention exhibits favorable sensitivity to g-line radiation, i-line radiation, KrF excimer lasers and electron beams, any of g-line radiation, i-line radiation, a KrF excimer laser or an electron beam may be selected as an exposure source.

In the third aspect of the present invention, an electron beam is preferably used as one of the exposure light sources as it enables the formation of particularly fine patterns. In other words, the above exposure step preferably involves conducting exposure using an electron beam, and at least one other exposure source selected from amongst g-line radiation, i-line radiation, and KrF excimer laser light. In this case, very fine patterns such as patterns with dimensions of 200 nm or less are formed using the electron beam, whereas rougher patterns such as patterns with dimensions exceeding 200 nm are formed using g-line radiation, i-line radiation or a KrF excimer laser. This enables a dramatic increase in the throughput compared with the case where only an electron beam is used for the exposure.

Moreover, the use of g-line and/or i-line radiation is preferred in terms of factors such as the low cost of the exposure apparatus, and the ability to reduce costs. In other words, the above step preferably involves conducting exposure using g-line radiation and/or i-line radiation, and an electron beam.

In those cases where two exposure light sources are used, the use of i-line radiation and an electron beam is particularly desirable.

The positive resist composition according to the third aspect of the present invention can be used favorably in a method for forming a resist pattern according to the fourth aspect of the present invention, which includes a step of conducting exposure using at least two exposure light sources selected from amongst g-line radiation, i-line radiation, a KrF excimer laser, and an electron beam.

<Method for Forming Resist Pattern According to the Fourth Aspect>

The method for forming a resist pattern according to the fourth aspect of the present invention includes the steps of: forming a resist film on a substrate using the positive resist composition according to the third aspect of the present invention described above, selectively exposing the resist film using at least two exposure light sources selected from amongst g-line radiation, i-line radiation, a KrF excimer laser and an electron beam, and subjecting the resist film to alkali developing to form a resist pattern.

The method for forming a resist pattern according to the fourth aspect of the present invention can be conducted, for example, in the manner described below.

Namely, the aforementioned positive resist composition according to the third aspect of the present invention is first applied to a substrate such as a silicon wafer using a spinner or the like, and a prebake is then conducted under temperature conditions of 60 to 180° C., for a period of 10 to 600 seconds, and preferably for 60 to 90 seconds, thereby forming a resist film. There are no particular restrictions on the film thickness of the resist film. However, the resist film thickness is preferably within a range from 100 nm to 10 μm, and even more preferably from 200 nm to 5 μm.

The resist film is then subjected to selective exposure with one exposure source (the first exposure light source) selected from amongst g-line radiation, i-line radiation, a KrF excimer laser and an electron beam, either through a desired mask pattern or without using a mask. In other words, either exposure is conducted via a mask pattern, or direct patterning is conducted by direct irradiation with an electron beam without using a mask pattern.

Subsequently, the resist film is subjected to selective exposure with another exposure source (the second exposure light source), which is selected from amongst g-line radiation, i-line radiation, a KrF excimer laser and an electron beam, but is different from the above first exposure light source, with the exposure conducted either through a desired mask pattern or without using a mask.

Following this selective exposure, a heat treatment (post exposure baking (PEB)) is conducted under temperature conditions of 80 to 150° C., for a period of 40 to 120 seconds, and preferably for 60 to 90 seconds. Subsequently, developing is conducted using an alkali developing liquid such as a 0.1 to 10% by weight aqueous solution of tetramethylammonium hydroxide (TMAH), thereby forming a resist pattern.

An organic or inorganic anti-reflective film may also be provided between the substrate and the applied layer of the resist composition.

There are no particular restrictions on the combination of the first exposure light source and the second exposure light source, which can be selected as appropriate from amongst g-line radiation, i-line radiation, a KrF excimer laser, and an electron beam.

In the present invention, as described above, a combination of an electron beam and at least one other exposure source selected from amongst g-line radiation, i-line radiation and KrF excimer laser light is preferred, a combination of g-line and/or i-line radiation and an electron beam is even more preferred, and a combination of i-line radiation and an electron beam is the most desirable.

The resist pattern formed in the manner described above can be used as a mask for etching, or as a frame for conducting plating or the like. Accordingly, the resist pattern can be used in production processes for MEMS (Micro Electro Mechanical Systems), which employ these types of steps. MEMS are highly advanced micro systems in which micromachining techniques are used to integrate a variety of microstructures (including functional elements such as sensors, and conductive structures such as wiring and connection terminals) on top of a substrate. Specific examples of MEMS include magnetic heads for magnetic recording media, perpendicular magnetic heads, and MRAM [(Magnetic Random Access Memory): nonvolatile memory that uses a GMR (giant magnetoresistive) film or TMR (tunnel magnetoresistive) film with a magnetoresistive effect as a memory element].

Next is a description of the fifth and sixth aspects of the present invention.

<Positive Resist Composition of the Fifth Aspect>

A positive resist composition according to the fifth aspect of the present invention contains a resin component (A)" (hereafter also referred to as the component (A)") that contains acid-dissociable, dissolution-inhibiting groups and displays increased alkali solubility under the action of acid, and an acid generator component (B)" (hereafter also referred to as the component (B)") that generates acid upon irradiation (exposure).

When the acid generated from the component (B)" by exposure acts upon the component (A)", the entire component (A)" changes from an alkali-insoluble state to an alkali-soluble state. As a result, when a resist film formed from this positive resist composition is either selectively exposed during the formation of a resist pattern, or alternatively is exposed and then subjected to post exposure baking, the exposed portions of the resist shift to an alkali-soluble state, whereas the unexposed portions remain insoluble in alkali, meaning alkali developing can then be used to form a positive resist pattern.

Component (A)"

In the positive resist composition according to the fifth aspect of the present invention, the component (A)" (hereafter also referred to as component (A)) is a similar resin to that of the first aspect, prepared by protecting a portion of all the hydroxyl groups within an alkali-soluble novolak resin with acid-dissociable, dissolution-inhibiting groups.

Component (B)"

In the positive resist composition according to the fifth aspect of the present invention, the component (B)" must include an oxime sulfonate-based acid generator (B1) (hereafter also referred to as the component (B1)) and an onium salt-based acid generator (B2) (hereafter also referred to as the component (B2)). By using this component (B)", a high-resolution resist pattern can be formed.

Component (B1)

As the component (B1), any of the various oxime sulfonate-based acid generators that have been proposed as acid generators for use within conventional chemically amplified resists can be used.

Here, in a similar manner to the first aspect, the oxime sulfonate-based acid generator describes either a compound that contains at least one group represented by the general formula (B-1) shown above, or a compound represented by the general formula (III) or (IV) shown above (see U.S. Pat. No. 6,004,724), wherein the compound generates acid upon irradiation.

As the oxime sulfonate-based acid generator, a similar compound to the first aspect represented by the above general formula (III) or (IV) (see U.S. Pat. No. 6,004,724) exhibits a particularly high acid generating efficiency relative to electron beam irradiation, and is consequently ideal.

Furthermore, besides these compounds and in the same manner as the first aspect, further examples of suitable compounds for the component (B1) include triazine compounds (VI) [bis(trichloromethyl)triazines] represented by the formula (VI) shown above, suitable combinations of this type of triazine compound (VI) and another triazine compound (VII) [a bis(trichloromethyl)triazine] represented by the formula (VII) shown above (see Japanese Unexamined Patent Application, First Publication No. Hei 6-289614 and Japanese Unexamined Patent Application, First Publication No. Hei 7-134412), compounds represented by a formula (VIII) shown above, and the compound represented by the formula (IX) shown above. Specific examples of the above triazine compounds (VI) and the above triazine compounds (VII) include the same triazine compounds (VI) and (VII) exemplified above in relation to the first aspect.

These compounds may be used either alone, or in combinations of two or more different compounds.

Of the compounds exemplified above, the compound represented by the above formula (V) and the compound represented by the above formula (IX) exhibit superior acid generating efficiency relative to electron beam irradiation, and are consequently preferred.

Component (B2)

There are no particular restrictions on the component (B2), and any of the various onium salt-based acid generators such as iodonium salts and sulfonium salts that have been proposed as acid generators for use within conventional chemically amplified resists can be used.

In the same manner as the first aspect, examples of suitable onium salt-based acid generators include compounds represented by the above formulas (b-1) and (b-2).

Specific examples of suitable onium salt-based acid generators include the same onium salt-based acid generators as those exemplified in relation to the first aspect.

Furthermore, in the same manner as the first aspect, compounds in which the anion portion within the above general formulas (b-1) and (b-2) has been substituted with an anion portion represented by the above general formula (b-3) or (b-4) (and in which the cation portion is the same as that shown in (b-1) or (b-2)) can also be used.

The blend quantity of the component (B)" is preferably within a range from 1 to 30 parts by weight, and even more preferably from 1 to 20 parts by weight, per 100 parts by weight of the component (A)" (the component (A)).

Furthermore, the ratio (weight ratio) between the blend quantities of the component (B1) and the component (B2) within the component (B)" is preferably within a range from (B1):(B2)=99:1 to 1:99, even more preferably from 95:5 to 50:50, even more preferably from 90:10 to 60:40, and is most preferably from 90:10 to 70:30. Provided this ratio is within the above range, superior effects are achieved for the present invention, and a favorable pattern shape and high degree of sensitivity are also obtained.

Optional Components

In the positive resist composition according to the fifth aspect of the present invention, in order to improve the resist pattern shape and the post exposure stability of the latent image formed by the pattern-wise exposure of the resist layer, a nitrogen-containing organic compound (D) (hereafter referred to as the component (D)) is preferably added to the composition.

There are no particular restrictions on the compound (D) provided it exhibits compatibility with the other components of the positive resist composition, and suitable compounds include those disclosed in Japanese Unexamined Patent Application, First Publication No. Hei 9-6001.

In particular, and in a similar manner to the first aspect, by adding a comparatively bulky specific basic compound (d1) represented by the general formula (X) shown above, the quantity of acid components produced as by-products during storage of the positive resist composition can be reduced, enabling the long-term storage stability of the positive resist composition to be improved.

Pyridine-based compounds can also be used as the component (D). In particular, 2,6-lutidine offers superior post exposure stability of the latent image formed by the pattern-wise exposure of the resist layer, and is consequently preferred.

As the component (D), either a single compound may be used alone, or a mixture of two or more different compounds may be used.

The component (D) is typically used in a quantity within a range from 0.01 to 5.0 parts by weight per 100 parts by weight of the component (A)" (the component (A)).

Furthermore, in order to prevent any deterioration in sensitivity caused by the addition of the above component (D), and improve the resist pattern shape and the post exposure stability of the latent image formed by the pattern-wise exposure of the resist layer, the same organic carboxylic acids, or phosphorus oxo acids or derivatives thereof (E) (hereafter referred to as the component (E)) as those exemplified in relation to the first aspect may also be added to the positive resist composition according to the fifth aspect of the present invention as another optional component. The component (D) and the component (E) can be used in combination, or either one can also be used alone.

The component (E) is typically used in a quantity within a range from 0.01 to 5.0 parts by weight per 100 parts by weight of the component (A)" (the component (A)).

As described below, adding a storage stabilizer to the positive resist composition according to the fifth aspect of the present invention enables decomposition reactions of the organic solvent to be suppressed, and is consequently preferred.

There are no particular restrictions on the storage stabilizer, provided it has the effect of suppressing decomposition reactions of the organic solvent, and suitable compounds include the antioxidants disclosed in Japanese Unexamined Patent Application, First Publication No. Sho 58-194834. Specific examples of these antioxidants include the same compound as those exemplified in relation to the first aspect.

A dye may also be added to the positive resist composition according to the fifth aspect of the present invention.

In the present invention, the term "dye" refers to a material that absorbs the radiation (exposure source) used for exposure during the formation of the resist pattern. Including this type of dye enables the sensitivity of the composition to the exposure light source to be adjusted. Furthermore, the effects of standing waves generated by the exposure light source can also be reduced, enabling a reduction in line edge roughness (LER), an improvement in the in-plane uniformity of the pattern dimensions, and an improvement in the depth of focus.

Other miscible additives can also be added to the positive resist composition of the fifth aspect of the present invention according to need, and examples include additive resins for improving the properties of the resist film, surfactants for improving the coating properties, dissolution inhibitors, plasticizers, colorants, and halation prevention agents.

The positive resist composition according to the fifth aspect of the present invention can be produced by dissolving the materials in an organic solvent.

The organic solvent may be any solvent capable of dissolving the various components used to generate a uniform solution, and one or more solvents selected from known materials used as the solvents for conventional chemically amplified resists can be used.

Specific examples of these organic solvents include the same organic solvents a those exemplified above in relation to the first aspect.

These organic solvents may be used either alone, or as a mixed solvent of two or more different solvents.

Furthermore, mixed solvents produced by mixing propylene glycol monomethyl ether acetate (PGMEA) with a polar solvent are preferred. Although the blend ratio (weight ratio) in such mixed solvents can be set in accordance with factors such as the co-solubility of the PGMEA and the polar solvent, the ratio is preferably within a range from 1:9 to 9:1, and is even more preferably from 2:8 to 8:2.

There are no particular restrictions on the quantity used of the organic solvent, although the quantity should be set in accordance with the coating film thickness required, at a concentration that enables favorable application of the solution to a substrate or the like, and typically, the quantity of solvent is set so that the solid fraction concentration of the resist composition falls within a range from 2 to 60% by weight, preferably from 5 to 50% by weight, and even more preferably from 5 to 40% by weight.

These organic solvents include some solvents that may decompose over time and generate acid by-products, although in the presence of the above component (D) or an aforementioned storage stabilizer, the decomposition reaction can be suppressed. Of the organic solvents listed above, this suppression effect is particularly marked for ester-based solvents including PGMEA and esters such as butyl acetate. As a result, in the presence of an aforementioned component (D) and/or a storage stabilizer, the use of an ester-based solvent as the organic solvent is preferred, and PGMEA is particularly desirable.

In the case of 2-heptanone for example, acid components that have been confirmed as decomposition by-products include formic acid, acetic acid and propionic acid.

<Method for Forming Resist Pattern According to the Sixth Aspect>

The method for forming a resist pattern according to the sixth aspect of the present invention can be conducted, for example, in the manner described below.

Namely, the aforementioned positive resist composition according to the fifth aspect of the present invention is first applied to a substrate such as a silicon wafer using a spinner or the like, and a prebake is then conducted under temperature conditions of 60 to 180° C., for a period of 10 to 600 seconds, and preferably for 60 to 90 seconds, thereby forming a resist film.

There are no particular restrictions on the film thickness of the resist film. However, the resist film is preferably a thick film with a thickness within a range from 100 nm to 10 µm, and even more preferably from 200 nm to 5 µm. According to the present invention, a high-resolution pattern can be formed even when a thick resist film with this type of film thickness is formed. As a result, a resist pattern with a high aspect ratio of 7 or greater can be obtained. A resist pattern with this type of high aspect ratio exhibits excellent resistance properties, including superior plating resistance, ion etching resistance and dry etching resistance, and is consequently ideal for the type of MEMS production described below.

The resist film is then subjected to selective exposure with an electron beam using an electron beam lithography apparatus, either by exposure through a desired mask pattern, or by direct patterning without using a mask. Following this exposure via a mask pattern, or patterning conducted by direct irradiation with the electron beam without using a mask pattern, a heat treatment (post exposure baking (PEB)) is conducted under temperature conditions of 80 to 150° C., for a period of 40 to 120 seconds, and preferably for 60 to 90 seconds. Subsequently, developing is conducted using an alkali developing liquid such as a 0.1 to 10% by weight aqueous solution of tetramethylammonium hydroxide (TMAH), thereby forming a resist pattern.

An organic or inorganic anti-reflective film may also be provided between the substrate and the applied layer of the resist composition.

The positive resist composition according to the fifth aspect of the present invention and the method for forming a resist pattern according to the sixth aspect described above can be used favorably within a mix and match method or MEMS (Micro Electro Mechanical Systems) production process described below.

Mix and Match

First is a description of a mix and match method.

Nowadays, techniques for forming high-resolution patterns are being investigated not only from the type of materials perspective described above, but also from a process perspective.

For example, multilayer resist methods have been proposed, including a three-layer resist method that uses a laminate prepared by laminating an organic film, an intermediate film formed from an inorganic film of silica or the like, and a resist film onto a substrate, and a two-layer resist method that is superior to the three-layer resist method in terms of requiring fewer production steps (for example, see Japanese Unexamined Patent Application, First Publication No. Hei 6-202338 and Japanese Unexamined Patent Application, First Publication No. Hei 8-29987). Using these multilayer methods enables high levels of resolution to be achieved.

However, multilayer resist methods suffer from various problems including a reduction in the throughput as a result of an increase in the number of process steps and a deterioration in the yield, as well as increased costs.

The problem of throughput is particularly critical for lithography processes that use an electron beam. In such lithography processes, although very high levels of resolution can be achieved, the exposure is usually conducted in a vacuum, either by conducting exposure through a desired mask pattern, or by direct patterning. As a result, a pressure reduction operation and purge operation must be conducted, meaning the process takes considerably longer than a process that uses an excimer laser or the like. Furthermore, particularly in the case of direct patterning using an electron beam, conducting patterning of the entire substrate takes an extremely long period of time.

Accordingly, in recent years, mix and match methods that involve conducting exposure with two or more different light sources are attracting considerable attention.

In these methods, formation of the entire pattern using the light source that is required for formation of very fine patterns, such as an electron beam, is replaced with a method in which the very fine patterns are formed with an electron beam, whereas those rough patterns that do not require a very high level of resolution are formed using a different light source such as a KrF excimer laser, with the exposure conducted via a mask pattern in a single step, and by reducing the time required to form the rough patterns, an improvement in the throughput can be achieved.

However, as described above, the composition of resist materials generally differs depending on the nature of the exposure light source being used, and resist materials tend not to exhibit sensitivity to three or more different light sources. For example, the non-chemically amplified resists used for exposure with g-line or i-line radiation generally exhibit no sensitivity relative to a KrF excimer laser or electron beam, meaning this combination of light sources cannot be used in a mix and match method. Consequently, there are restrictions as to the combinations of light sources that can be used in a mix and match method.

Accordingly, there is considerable demand for a resist material that can be used within mix and match methods using combinations of any of the various light sources. Of the various possibilities, the demands are particularly strong for a resist material that can be used in a mix and match method that employs a combination of an electron beam, which enables formation of very high-resolution patterns, with another light source, and particularly the most widely used and low-cost g-line and/or i-line radiation sources.

As described above, the positive resist composition according to the fifth aspect of the present invention exhibits excellent resolution, and contains an oxime sulfonate-based acid generator (B1) that generates acid readily upon irradiation with g-line radiation, i-line radiation, a KrF excimer laser or an electron beam, and consequently the composition exhibits favorable sensitivity to g-line radiation, i-line radiation, KrF excimer lasers and electron beams. As a result, a mix and match can be conducted regardless of which exposure light sources are chosen from amongst g-line radiation, i-line radiation, a KrF excimer laser or an electron beam, although in those cases where a mix and match is conducted using the positive resist composition for use with an electron beam according to the fifth aspect of the present invention, an electron beam must be used as one of the exposure sources. Accordingly, the exposure step preferably is preferably conducted using an electron beam and at least one other exposure light source selected from amongst g-line radiation, i-line radiation, and a KrF excimer laser. In such a case, very fine patterns such as patterns with dimensions of 200 nm or less are formed using the electron beam, whereas rougher patterns such as patterns with dimensions exceeding 200 nm are formed using g-line radiation, i-line radiation or a KrF excimer laser. This enables a dramatic increase in the throughput compared with the case where only an electron beam is used for the exposure.

Moreover, the use of g-line and/or i-line radiation is preferred in terms of factors such as the low cost of the exposure apparatus, and the ability to reduce costs. In other words, the above step preferably involves conducting exposure using g-line radiation and/or i-line radiation, and an electron beam.

In those cases where two exposure light sources are used, the use of i-line radiation and an electron beam is particularly desirable.

Pattern formation using a mix and match method can be conducted, for example, in the manner described below.

First, a resist film is formed in the same manner as described above.

This resist film is then subjected to selective exposure with one exposure source (the first exposure light source) selected from amongst g-line radiation, i-line radiation, a KrF excimer laser and an electron beam, either through a desired mask pattern or without using a mask. In other words, either exposure is conducted via a mask pattern, or direct patterning is conducted by direct irradiation with an electron beam without using a mask pattern.

Subsequently, the resist film is subjected to selective exposure with another exposure source (the second exposure light source), which is selected from amongst g-line radiation, i-line radiation, a KrF excimer laser and an electron beam, but is different from the above first exposure light source, with the exposure conducted either through a desired mask pattern or without using a mask.

Following this selective exposure, PEB is conducted in the same manner as described above, and a developing treatment is then performed using an alkali developing liquid, thereby forming a resist pattern.

In the combination of the first exposure light source and the second exposure light source, one of the sources must be an electron beam, and the other light source may be selected appropriately from amongst g-line radiation, i-line radiation and a KrF excimer laser. In the present invention, as described above, a combination of g-line radiation and/or i-line radiation and an electron beam is preferred, and a combination of i-line radiation and an electron beam is the most desirable.

MEMS Production Process

Next is a description of a MEMS production process.

MEMS are highly advanced micro systems in which micromachining techniques that enable three dimensional microfabrication are used to integrate a variety of microstructures (including functional elements such as sensors, electrodes, wiring, and connection terminals such as bumps and leads) on top of a substrate. MEMS are expected to expand into a variety of fields including the telecommunications, automotive, medical and biotechnology fields, as the various sensors and the like for the magnetic heads of magnetic recording media and the like.

The micromachining techniques used in the production of these MEMS typically employ lithography techniques. For example, Japanese Unexamined Patent Application, First Publication No. 2002-110536 discloses a method of producing a microdevice such as a magnetic head using a resist pattern of a specific shape.

As MEMS undergo ever increasing miniaturization, resist materials capable of forming high-resolution resist patterns are being demanded in order to enable the required microfabrication to be conducted.

As described above, these miniaturization techniques typically involve shortening the wavelength of the exposure light source, and recently, there have been growing demands for a resist material that exhibits favorable sensitivity to electron beams and is capable of forming high-resolution patterns, for use as a resist material that can be applied to MEMS production processes using an electron beam.

However, although a conventional chemically amplified positive resist composition that uses, for example, a PHS-based resin in which the hydroxyl groups have been protected with acid-dissociable, dissolution-inhibiting groups as the resin component exhibits sensitivity relative to an electron beam, the composition does not offer satisfactory levels of the various resistance properties required for MEMS production.

Namely, in the production of these MEMS, in addition to lithography steps, steps for forming conductive structures such as wiring by using plating methods and the like are also conducted. Furthermore, a variety of other steps may also conducted, including dry etching, ion implantation (hereafter referred to as an implant) in which impurities such as phosphorus or boron are ionized within a vacuum, and then accelerated by a strong electric field and driven into the surface of a substrate, and ion etching steps such as ion milling, and for example in the production of a magnetic head, ion etching of a magnetic film is conducted using a resist pattern. Furthermore, in these steps, the resist pattern is frequently subjected to heating. As a result, the resist material used in a MEMS production requires favorable levels of plating resistance, heat resistance, dry etching resistance, implant resistance and ion etching resistance, as well as superior adhesion to substrates.

However, if the type of conventional chemically amplified positive resist composition described above is used, the resist composition does not satisfy the above requirements. For example, resist pattern swelling and the like may occur during plating treatment, which can cause problems such as peeling of the plating. Furthermore, if heated at a high temperature such as 130° C., the shape of the resist pattern tends to deteriorate as a result of heat sag.

In contrast, the positive resist composition according to the fifth aspect of the present invention not only exhibits sensitivity to an electron beam, enabling the formation of high-resolution patterns, but because it uses a novolak resin as the component (A)", also exhibits superior levels of the properties described above, meaning the composition is ideal for the production of MEMS using an electron beam.

Specific examples of MEMS include magnetic heads for magnetic recording media, perpendicular magnetic heads, and MRAM [(Magnetic Random Access Memory): nonvolatile memory that uses a GMR (giant magnetoresistive) film or TMR (tunnel magnetoresistive) film with a magnetoresistive effect as a memory element].

The following example of a MEMS production process using the sixth aspect of the present invention is identical to the MEMS production process described above for the second aspect using FIG. 1A through FIG. 2C, with the exception that during selective exposure of the resist film 4', the selective exposure is conducted from above the resist film 4' using an electron beam, either via a mask pattern, or by direct irradiation without using a mask pattern.

The above example of a MEMS production process presented the example of a process for producing a magnetic head, in which the magnetic film 2 was laminated on top of the substrate 1, but the present invention is not restricted to this configuration, and the positive resist composition according to the fifth aspect of the present invention can be used in all manner of MEMS production processes, including those in which a magnetic film is not provided, such as the production of MRAM or the like.

As described above, according to the positive resist composition of the fifth aspect of the present invention and the method for forming a resist pattern of the sixth aspect, a high-resolution resist pattern can be formed. In those cases where electron beam lithography is used, an extremely high-resolution resist pattern can be formed. The reasons that the combination of the above component (A)", and the component (B)" containing the two specific acid generators (B1) and (B2) yield the effects described above are not entirely clear, although it is thought that by using the component (B2) in combination with the component (B1), the acid strength can be increased, thereby increasing the contrast and improving the resolution.

Furthermore, because the positive resist composition according to the fifth aspect of the present invention includes the acid generator (B1) that generates acid upon irradiation with g-line radiation, i-line radiation, a KrF excimer laser or an electron beam, the composition exhibits favorable sensitivity to g-line radiation, i-line radiation, KrF excimer lasers and electron beams. Accordingly, the composition is ideal for a mix and match process in which at least two exposure light sources selected from amongst g-line radiation, i-line radiation, a KrF excimer laser and an electron beam are used for the exposure.

Moreover, because the positive resist composition according to the fifth aspect of the present invention uses a resin based on a novolak resin as the component (A)", the composition exhibits favorable levels of plating resistance, heat resistance, dry etching resistance, implant resistance and ion etching resistance, as well as superior adhesion to substrates. Accordingly, the composition is ideal for the production of MEMS, and particularly the production of MEMS using an electron beam.

EXAMPLES

As follows is a more detailed description of the present invention using a series of examples, although the present invention is in no way limited by the examples presented below.

In an example 1 and comparative examples 1 to 3 described below, the following resins (A)-1 to (A)-4 were used as the component (A).

Resin (A)-1

A novolak resin 1 for which Mw=5,462 and Mw/Mn=10 was synthesized by normal methods, using a phenol mixture in which m-cresol/p-cresol=6/4 (molar ratio) and an aldehyde mixture in which formaldehyde/salicylaldehyde=1/0.3 (molar ratio).

The novolak resin 1 was dissolved in methyl isobutyl ketone (MIBK) solvent by stirring, in sufficient quantity to generate a solution with a concentration of 30% by weight, and following raising of the internal temperature to 100 to 110° C., a compound represented by a formula (I-1) shown below was added dropwise in a quantity equivalent to 8 parts by weight of the compound per 100 parts by weight of the resin solid fraction.

Following reaction for 24 hours, the resulting solution was stirred for at least 12 hours at room temperature, and a solvent replacement was then conducted to alter the solvent from MIBK to 2-heptanone.

As a result, a resin (A)-1 was obtained, for which Mw=38,200, and in which 7.5% of the hydroxyl groups of the novolak resin 1 had been protected.

[Formula 16]

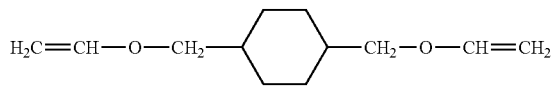

(I-1)

Resin (A-2)

A polyhydroxystyrene with Mw=2,500 (product name: VPS-2520, manufactured by Nippon Soda Co., Ltd.)

Resin (A-3)

The above resin (A)-2 was dissolved in methyl isobutyl ketone (MIBK) solvent by stirring, in sufficient quantity to generate a solution with a concentration of 30% by weight, and following raising of the internal temperature to 100 to 110° C., the compound represented by the above formula (I-1) was added dropwise in a quantity equivalent to 8 parts by weight of the compound per 100 parts by weight of the resin solid fraction.

Following reaction for 24 hours, the resulting solution was stirred for at least 12 hours at room temperature, and a solvent replacement was then conducted to alter the solvent from MIBK to 2-heptanone.

As a result, a resin (A)-3 was obtained, for which Mw=20,000, and in which 7% of the hydroxyl groups of the resin (A)-2 had been protected.

Resin (A)-4

A novolak resin for which Mw=4,000 was synthesized by normal methods, using m-cresol, and an aldehyde mixture in which formaldehyde/salicylaldehyde=1/0.3 (molar ratio).

Example 1, Comparative Examples 1 to 3

The components shown below in Table 1 were mixed together and dissolved, yielding a series of positive resist composition solutions. In Table 1, the numerical values within the square brackets [ ] represent blend quantities (parts by weight). Furthermore, the labels in Table 1 have the meanings shown below.

(B)-1: the compound represented by the formula (V) shown above (D-1): 2,6-lutidine (D)-2: tri-n-decylamine Add1: an antioxidant (2,6-di(tert-butyl)-p-cresol, product name: BHT SWANOX, manufactured by Seiko Chemical Co., Ltd.)

Add2: a surfactant (product name: XR-104, manufactured by Dainippon Ink and Chemicals, Incorporated)

(S)-1: a mixed solvent of PGMEA/butyl acetate=7/3 (weight ratio)

TABLE 1

|  | Component (A) | Component (B) | Component (D) | | Other Components | | Organic solvent |
| --- | --- | --- | --- | --- | --- | --- | --- |
| Example 1 | (A)-1 [100] | (B)-1 [2.0] | (D)-1 [0.5] | (D)-2 [0.5] | Add1 [0.5] | Add2 [0.065] | (S-1) [560] |
| Comparative example 1 | (A)-2 [100] | (B)-1 [2.0] | (D)-1 [0.5] | (D)-2 [0.5] | Add1 [0.5] | Add2 [0.065] | (S-1) [560] |
| Comparative example 2 | (A)-3 [100] | (B)-1 [2.0] | (D)-1 [0.5] | (D)-2 [0.5] | Add1 [0.5] | Add2 [0.065] | (S-1) [560] |
| Comparative example 3 | (A)-4 [100] | (B)-1 [2.0] | (D)-1 [0.5] | (D)-2 [0.5] | Add1 [0.5] | Add2 [0.065] | (S-1) [560] |

Subsequently, each of the positive resist compositions was evaluated in the manner described below.

(1) Resolution

Each of the thus obtained positive resist composition solutions was applied uniformly to the surface of an 8-inch silicon substrate that had been treated with hexamethyldisilazane, and was then subjected to a prebake treatment (PAB) at 130° C. for 90 seconds, thus forming a resist film with a film thickness of 500 nm.

This resist film was then subjected to direct patterning with an electron beam lithography apparatus (HL-800D, manufactured by Hitachi Ltd., accelerating voltage: 70 kV), and was then subjected to a bake treatment (PEB) at 110° C. for 90 seconds, developed for 60 seconds in a 2.38% by weight aqueous TMAH solution (at 23° C.), rinsed in pure water for 30 seconds, shaken dry, and then subjected to a postbake treatment at 100° C. for 60 seconds.

The substrate was then inspected using a scanning electron microscope (SEM), and the critical resolution (nm) at the optimum exposure dose Eop for formation of a trench pattern of width 80 nm was determined. The result is shown in Table 2 as the "resolution".

For those composition solutions for which a pattern could not be formed, a "–" result was recorded.

(2) Plating Resistance

A substrate with a pattern formed thereon from the above evaluation (1) was subjected to an electrolytic plating treatment for 40 minutes at 65° C., using a non-cyan-based gold sulfite plating solution.

Subsequently, the state of the gold plating was inspected using an optical microscope or an electron microscope, and samples which showed no peeling of the gold plate were evaluated using the symbol O, whereas samples in which peeling was observed were evaluated using the symbol x. The results are shown in Table 2 as the "plating resistance".

(3) Heat Resistance

Using the same method as the above evaluation (1), the temperature of the post-developing postbake was altered from 100° C. to 130° C., a postbake was conducted for 300 seconds, and the cross-sectional shape of the formed pattern was then inspected using a SEM. Those resists which had undergone heat sag were evaluated using the symbol x, whereas those resists in which the shape had been retained were evaluated using the symbol O. The results are shown in Table 2 as the "heat resistance".

TABLE 2

|  | Resolution | Plating resistance | Heat resistance |
| --- | --- | --- | --- |
| Example 1 | 80 nm | o | o |
| Comparative example 1 | — | — | — |
| Comparative example 2 | 80 nm | x | x |
| Comparative example 3 | — | — | — |

From the results in Table 2 it is evident that the example 1, which used the resin (A)-1 that represents a reaction product of a novolak resin and the compound represented by the formula (I-1) as the component (A), was able to form a pattern, and therefore exhibits favorable sensitivity to electron beams. Furthermore, the resolution of the pattern was at least as good as that of the comparative example 2, and the plating resistance and heat resistance were superior.

In contrast, the comparative examples 1 and 3, which instead of the resin (A)-1 used either a polyhydroxystyrene or novolak resin that had not been protected with acid-dissociable, dissolution-inhibiting groups, were unable to form patterns. Furthermore, the comparative example 2, which used the resin (A)-3 that represents a reaction product of a polyhydroxystyrene and the compound represented by the formula (I-1), exhibited a similar resolution to that of the example 1, but suffered from poor plating resistance and heat resistance.

In the example 2 and the reference example 1 described below, the resin (A)-1 obtained in the same manner as that described above was used as the component (A)'.

Example 2, Reference Example 1

The components shown below in Table 3 were mixed together and dissolved, yielding positive resist composition solutions.

In Table 3, the numerical values within the square brackets [ ] represent blend quantities (parts by weight). Furthermore, the labels in Table 3 have the meanings shown below.

(B)-1: the compound represented by the formula (V) shown above (B)-2: triphenylsulfonium nonafluorobutanesulfonate (D-1): 2,6-lutidine (D)-2: tri-n-decylamine Add1: an antioxidant (2,6-di(tert-butyl)-p-cresol, product name: BHT SWANOX, manufactured by Seiko Chemical Co., Ltd.)

Add2: a surfactant (product name: XR-104, manufactured by Dainippon Ink and Chemicals, Incorporated)

(S)-1: a mixed solvent of PGMEA/butyl acetate=7/3 (weight ratio)

TABLE 3

|  | Component (A)' | Component (B)' | Component (D) | | Other Components | | Organic solvent |
|---|---|---|---|---|---|---|---|
| Example 2 | (A)-1 | (B)-1 | (D)-1 | (D)-2 | Add1 | Add2 | (S-1) |
|  | [100] | [2.0] | [0.5] | [0.5] | [0.5] | [0.065] | [560] |
| Reference example 1 | (A)-1 | (B)-2 | (D)-1 | (D)-2 | Add1 | Add2 | (S-1) |
|  | [100] | [2.0] | [0.5] | [0.5] | [0.5] | [0.065] | [560] |

Subsequently, the thus obtained positive resist compositions were evaluated in the manner described below.

(Sensitivity Relative to an Electron Beam)

Each of the thus obtained positive resist composition solutions was applied uniformly to the surface of an 8-inch silicon substrate that had been treated with hexamethyldisilazane, and was then subjected to a prebake treatment (PAB) at 130° C. for 90 seconds, thus forming a resist film with a film thickness of 500 nm.

This resist film was then subjected to direct patterning with an electron beam lithography apparatus (HL-800D, manufactured by Hitachi Ltd., accelerating voltage: 70 kV), and was then subjected to a bake treatment (PEB) at 110° C. for 90 seconds, and then developed for 60 seconds in a 2.38% by weight aqueous TMAH solution (at 23° C.).

The substrate was then inspected using a scanning electron microscope (SEM) to determine whether or not a pattern had been formed.

The results revealed that a pattern had been formed for both the example 2 and the reference example 1, confirming that both compositions exhibited sensitivity to electron beams.

(Sensitivity Relative to KrF Excimer Laser)

A resist film with a film thickness of 500 nm was formed in the same manner as that described above, and this resist film was selectively irradiated with a KrF excimer laser (248 nm) through a mask pattern using a KrF exposure apparatus FPA3000EX3 (manufactured by Canon Inc., NA (numerical aperture)=0.55, σ=0.55), and was then subjected to a bake treatment (PEB) at 110° C. for 90 seconds, and then developed for 60 seconds in a 2.38% by weight aqueous TMAH solution (at 23° C.).

When the substrates were then inspected using a scanning electron microscope (SEM) to determine whether or not a pattern had been formed, it was found that a pattern had been formed for both the example 2 and the reference example 1, confirming that both compositions exhibited sensitivity to a KrF excimer laser.

(Sensitivity Relative to g-Line Radiation)

A resist film with a film thickness of 500 nm was formed in the same manner as that described above, and this resist film was selectively irradiated with g-line radiation (436 nm) through a mask pattern using a NSR-1505G7E apparatus (manufactured by Nikon Corporation), and was then subjected to a bake treatment (PEB) at 110° C. for 90 seconds, and then developed for 60 seconds in a 2.38% by weight aqueous TMAH solution (at 23° C.).

As a result, a pattern was able to be formed for the example 2, confirming that the composition exhibited sensitivity to g-line radiation. In contrast, in the case of the reference example 1, a pattern was unable to be formed, indicating that the composition lacked sensitivity to g-line radiation.

(Sensitivity Relative to i-Line Radiation)

A resist film with a film thickness of 500 nm was formed in the same manner as that described above, and this resist film was selectively irradiated with i-line radiation (365 nm) through a mask pattern using a NSR2205i14E apparatus (manufactured by Nikon Corporation), and was then subjected to a bake treatment (PEB) at 110° C. for 90 seconds, and then developed for 60 seconds in a 2.38% by weight aqueous TMAH solution (at 23° C.).

As a result, a pattern was able to be formed for the example 2, confirming that the composition exhibited sensitivity to i-line radiation. In contrast, in the case of the reference example 1, a pattern was unable to be formed, indicating that the composition lacked sensitivity to i-line radiation.

From the above results it is evident that the positive resist composition of the example 2 exhibits favorable sensitivity relative to all of the exposure light sources, namely, g-line radiation, i-line radiation, a KrF excimer laser and an electron beam, meaning a mix and match process can be conducted using any two or more of these exposure sources.

Next, an actual mix and match process was conducted. Namely, using the positive resist composition of the example 2 and following the sequence shown in FIG. 3 through FIG. 6B, a resist pattern was formed by a mix and match method using i-line radiation and an electron beam, and plating was then conducted. The exposure conditions for the i-line radiation and the electron beam were the same as those used in the above evaluations. In FIG. 3 through FIG. 6B, for the convenience of explanation, some portions are not shown exactly to scale.

Figure 3:
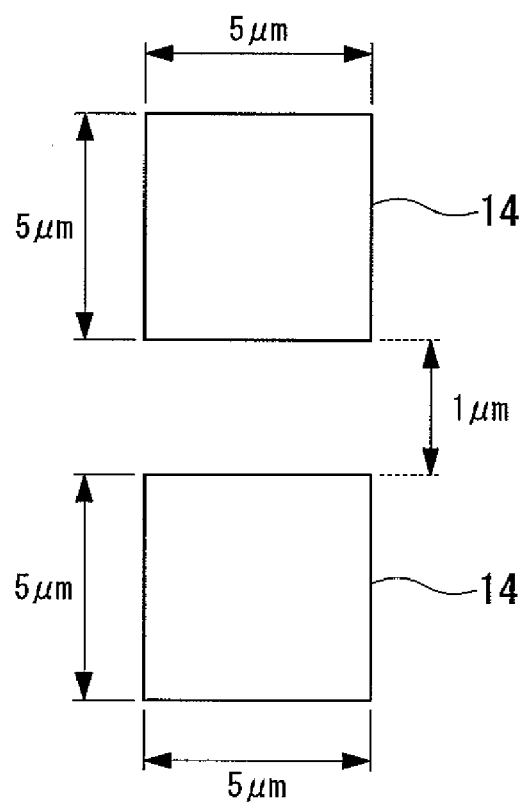
FIG. 3 is a diagram describing a step of forming a resist pattern by a mix and match method using i-line radiation and an electron beam.
Figure 4:
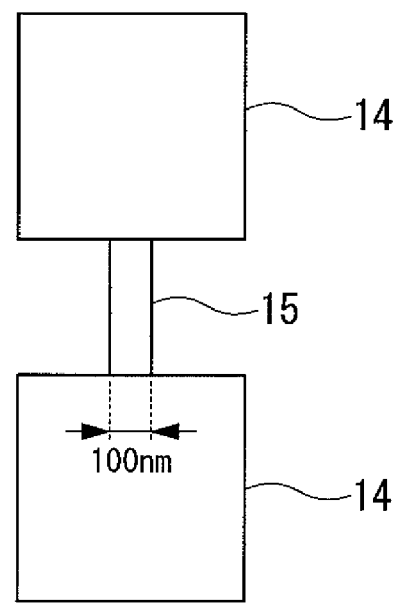
FIG. 4 is a diagram describing a step of forming a resist pattern by a mix and match method using i-line radiation and an electron beam.
Figure 5:
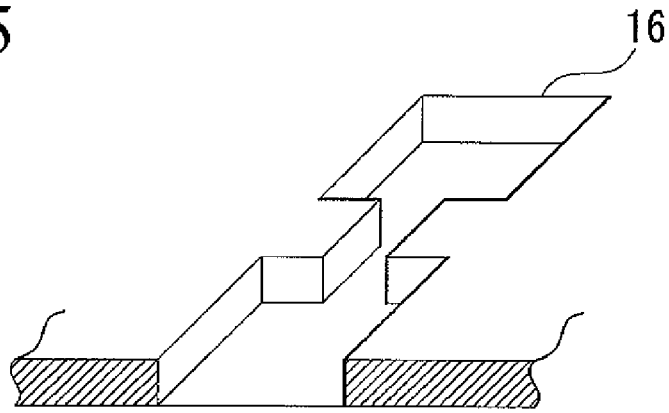
FIG. 5 is a perspective view showing a resist pattern formed by a mix and match method using i-line radiation and an electron beam.

First, as shown in FIG. 3, i-line radiation was used to form 5 μm square, large-area patterns 14 with a pattern spacing of 1 μm. Next, as shown in FIG. 4, an electron beam was used to form a trench pattern 15 with a width of 100 nm that connected the large-area patterns 14. In this manner, a resist pattern 16 including the large-area patterns 14 linked together by the trench pattern 15 was able to be formed. A perspective view of the resist pattern 16 is shown in FIG. 5.

Figure 6A:
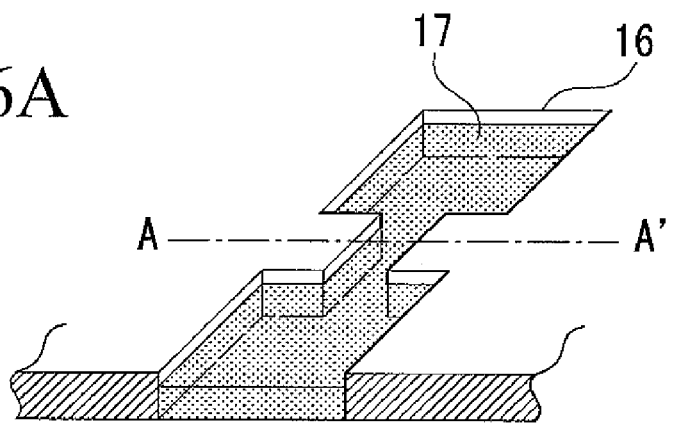
FIG. 6A is a diagram describing a step of conducting plating within a resist pattern formed by a mix and match method using i-line radiation and an electron beam.
Figure 6B:
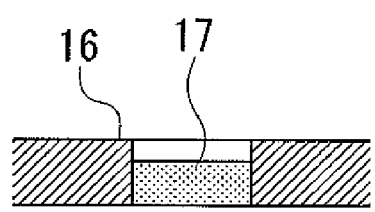
FIG. 6B is a diagram describing a step of conducting plating within a resist pattern formed by a mix and match method using i-line radiation and an electron beam.

Subsequently, the thus formed resist pattern 16 was subjected to an electrolytic plating treatment for 40 minutes at 65° C., using a non-cyan-based gold sulfite plating solution, thereby forming plating within the resist-free portions and forming a plating pattern 17. In this step, as shown in FIG. 6A, the resist-free portions were not filled entirely, so that the height of the resist film remained slightly higher than the plating. FIG. 6B shows a longitudinal cross-sectional view along the line A-A' in FIG. 6A. Finally, a conventional technique was used to remove the resist film.

The plating pattern 17 formed in this manner can be used, for example, in the production of a magnetic head.

In the example 3 and the reference example 2 described below, the resin (A)-1 obtained in the same manner as that described above was used as the component (A)".

Furthermore, in the table shown below, the numerical values within the square brackets [ ] represent blend quantities (parts by weight). Furthermore, the labels in the table have the meanings shown below.

(B)-1: the compound represented by the formula (V) shown above (B)-2: triphenylsulfonium nonafluorobutanesulfonate (D)-1): 2,6-lutidine (D)-2: tri-n-decylamine Add1: an antioxidant (2,6-di(tert-butyl)-p-cresol, product name: BHT SWANOX, manufactured by Seiko Chemical Co., Ltd.)

Add2: a surfactant (product name: XR-104, manufactured by Dainippon Ink and Chemicals, Incorporated)

Add3: a dye (product name: HHBP, manufactured by Daito Chemix Corporation)

(S)-1: a mixed solvent of PGMEA/butyl acetate=7/3 (weight ratio)

Example 3, Reference Example 2

The components shown below in Table 4 were mixed together and dissolved, yielding positive resist composition solutions.

TABLE 4

| | Component (A)" | Component (B)" | | Component (D) | | Other Components | | | Organic solvent |
|---|---|---|---|---|---|---|---|---|---|
| Example 3 | (A)-1 [100] | (B)-1 [2.0] | (B)-2 [0.5] | (D)-1 [0.5] | (D)-2 [0.5] | Add1 [0.5] | Add2 [0.065] | Add3 [3.0] | (S-1) [560] |
| Reference example 2 | (A)-1 [100] | (B)-1 [2.0] | — | (D)-1 [0.5] | (D)-2 [0.5] | Add1 [0.5] | Add2 [0.065] | Add3 [3.0] | (S-1) [560] |

Subsequently, the thus obtained positive resist compositions were evaluated in the manner described below.

Each of the thus obtained positive resist composition solutions was applied uniformly to the surface of an 8-inch silicon substrate that had been treated with hexamethyldisilazane, and was then subjected to a prebake treatment (PAB) at 130° C. for 90 seconds, thus forming a resist film with a film thickness of 500 nm.

This resist film was then subjected to direct patterning with an electron beam lithography apparatus (HL-800D, manufactured by Hitachi Ltd., accelerating voltage: 70 kV), and was then subjected to a bake treatment (PEB) at 110° C. for 90 seconds, developed for 60 seconds in a 2.38% by weight aqueous TMAH solution (at 23° C.), rinsed in pure water for 30 seconds, shaken dry, and then subjected to a postbake treatment at 100° C. for 60 seconds.

The substrate was then inspected using a scanning electron microscope (SEM), and the critical resolution (nm) at the optimum exposure dose Eop for formation of a trench pattern of width 80 nm was determined. The result is shown in Table 5 as the "resolution".

TABLE 5

| | Resolution |
|---|---|
| Example 3 | 70 nm |
| Reference example 2 | 80 nm |

From the results in Table 5 it is evident that the example 3, which used the resin (A)-1 that represents a reaction product of a novolak resin and the compound represented by the formula (I-1) as the component (A)", and a mixture of the compounds (B)-1 and (B)-2 as the component (B)", was able to form a high-resolution resist pattern.

In contrast, the reference example 2, which used only the compound (B)-1 as the component (B)", exhibited a lower level of resolution than the example 3.

Reference Example 3

The components shown below in Table 6 were mixed together and dissolved, yielding a positive resist composition solution.

TABLE 6

| | Component (A)" | Component (B)" | Component (D) | | Other Components | | Organic solvent |
|---|---|---|---|---|---|---|---|
| Reference Example 3 | (A)-1 [100] | (B)-1 [2.0] | (D)-1 [0.5] | (D)-2 [0.5] | Add1 [0.5] | Add2 [0.065] | (S-1) [560] |

Subsequently, the thus obtained positive resist composition was evaluated in the manner described below.

(Sensitivity Relative to an Electron Beam)

The thus obtained positive resist composition solution was applied uniformly to the surface of an 8-inch silicon substrate that had been treated with hexamethyldisilazane, and was then subjected to a prebake treatment (PAB) at 130° C. for 90 seconds, thus forming a resist film with a film thickness of 500 nm.

This resist film was then subjected to direct patterning with an electron beam lithography apparatus (HL-800D, manufactured by Hitachi Ltd., accelerating voltage: 70 kV), and was then subjected to a bake treatment (PEB) at 110° C. for 90 seconds, and then developed for 60 seconds in a 2.38% by weight aqueous TMAH solution (at 23° C.)

The substrate was then inspected using a scanning electron microscope (SEM) to determine whether or not a pattern had been formed, and the inspection revealed that a pattern had been formed. This confirmed that the compound (B)-1 generated acid upon irradiation with the electron beam.

(Sensitivity Relative to KrF Excimer Laser)

A resist film with a film thickness of 500 nm was formed in the same manner as that described above, and this resist film was selectively irradiated with a KrF excimer laser (248 nm) through a mask pattern using a KrF exposure apparatus FPA3000EX3 (manufactured by Canon Inc., NA (numerical aperture)=0.55, σ=0.55), and was then subjected to a bake treatment (PEB) at 10° C. for 90 seconds, and then developed for 60 seconds in a 2.38% by weight aqueous TMAH solution (at 23° C.).

The substrate was then inspected using a scanning electron microscope (SEM) to determine whether or not a pattern had been formed, and the inspection revealed that a pattern had been formed. This confirmed that the compound (B)-1 generated acid upon irradiation with the KrF excimer laser.

(Sensitivity Relative to g-Line Radiation)

A resist film with a film thickness of 500 nm was formed in the same manner as that described above, and this resist film was selectively irradiated with g-line radiation (436 nm) through a mask pattern using a NSR-1505G7E apparatus (manufactured by Nikon Corporation), and was then subjected to a bake treatment (PEB) at 110° C. for 90 seconds, and then developed for 60 seconds in a 2.38% by weight aqueous TMAH solution (at 23° C.).

As a result, a pattern was able to be formed. This confirmed that the compound (B)-1 generated acid upon irradiation with g-line radiation.

(Sensitivity Relative to i-Line Radiation)

A resist film with a film thickness of 500 nm was formed in the same manner as that described above, and this resist film was selectively irradiated with i-line radiation (365 nm) through a mask pattern using a NSR2205i14E apparatus (manufactured by Nikon Corporation), and was then subjected to a bake treatment (PEB) at 110° C. for 90 seconds, and then developed for 60 seconds in a 2.38% by weight aqueous TMAH solution (at 23° C.).

As a result, a pattern was able to be formed. This confirmed that the compound (B)-1 generated acid upon irradiation with i-line radiation.

The above results confirmed that the compound (B)-1 (the compound represented by the above formula (V)) generated acid upon irradiation with any one of g-line radiation, i-line radiation, a KrF excimer laser, and an electron beam.

As is evident from these results, the positive resist composition of the reference example 3 exhibits sensitivity to g-line radiation, i-line radiation, KrF excimer lasers and electron beams, and can therefore by used in a mix and match method that uses any two or more of these exposure sources.

Next, an actual mix and match process was conducted. Namely, using the positive resist composition of the reference example 3 and following the sequence shown in FIG. 3 through FIG. 6B, a resist pattern was formed by a mix and match method using i-line radiation and an electron beam, and plating was then conducted. The exposure conditions for the i-line radiation and the electron beam were the same as those used in the above evaluations. In FIG. 3 through FIG. 6B, for the convenience of explanation, some portions are not shown exactly to scale.

First, as shown in FIG. 3, i-line radiation was used to form 5 μm square, large-area patterns 14 with a pattern spacing of 1 μm. Next, as shown in FIG. 4, an electron beam was used to form a trench pattern 15 with a width of 100 nm that connected the large-area patterns 14. In this manner, a resist pattern 16 including the large-area patterns 14 linked together by the trench pattern 15 was able to be formed. A perspective view of the resist pattern 16 is shown in FIG. 5.

Subsequently, the thus formed resist pattern 16 was subjected to an electrolytic plating treatment for 40 minutes at 65° C., using a non-cyan-based gold sulfite plating solution, thereby forming plating within the resist-free portions and forming a plating pattern 17. In this step, as shown in FIG. 6A, the resist-free portions were not filled entirely, so that the height of the resist film remained slightly higher than the plating. FIG. 6B shows a longitudinal cross-sectional view along the line A-A' in FIG. 6A. Finally, a conventional technique was used to remove the resist film.

The plating pattern 17 formed in this manner can be used, for example, in the production of a magnetic head.

INDUSTRIAL APPLICABILITY

According to the first and second aspects of the present invention, a positive resist composition and a method for forming a resist pattern can be provided that exhibit favorable sensitivity to an electron beam, enable formation of a high-resolution resist pattern with excellent plating resistance and heat resistance, and are ideal for producing MEMS using an electron beam.

According to the third and fourth aspects of the present invention, a positive resist composition and a method for forming a resist pattern can be provided that exhibit favorable sensitivity to g-line radiation, i-line radiation, a KrF excimer laser and an electron beam, and can be used in a process in which exposure is conducted using at least two exposure light sources selected from amongst g-line radiation, i-line radiation, a KrF excimer laser, and an electron beam. By employing this positive resist composition and method for forming a resist pattern, a mix and match exposure can be conducted using any of g-line radiation, i-line radiation, a KrF excimer laser, and an electron beam.

According to the fifth and sixth aspects of the present invention, a positive resist composition for use with an electron beam and a method for forming a resist pattern that enable the formation of a high-resolution resist pattern can be provided.

The invention claimed is:

1. A method for forming a resist pattern, comprising:
    forming a resist film on a substrate using a positive resist composition;
    selectively forming a fine resist pattern in said resist film by exposing said resist film to an electron beam;
    selectively forming a rough resist pattern having dimensions greater than the dimensions of the fine resist pattern by exposing said resist film to and at least one other exposure light source selected from the group consisting of g-line radiation, i-line radiation, and a KrF excimer wherein the fine and rough resist patterns are formed in either order so as to perform a mix and match method; and
    subjecting said resist film to alkali developing to form a resist pattern,
    wherein the positive resist composition comprises a resin component (A)' that contains acid-dissociable, dissolution-inhibiting groups and increases alkali solubility under action of acid, and an acid generator component (B)' that generates acid upon irradiation with both said electron beam and said at least one other exposure light source.

2. A method for forming a resist pattern according to claim 1, wherein said resin component (A)' is a resin prepared by protecting a portion of all hydroxyl groups within an alkali-soluble novolak resin with acid-dissociable, dissolution-inhibiting groups.

3. A method for forming a resist pattern according to claim 2, wherein said resin component (A)' is a reaction product of an alkali-soluble novolak resin and a compound represented by a general formula (I) shown below:

[wherein, R1 represents either an alkylene group of 1 to 10 carbon atoms that may contain a substituent group and may include ether linkage within a main chain, or a group represented by a general formula (II) shown below:]

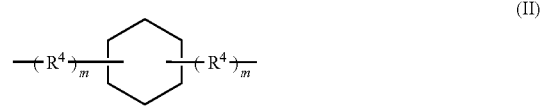

[wherein, $R^4$ represents an alkylene group of 1 to 10 carbon atoms that may contain a substituent group, and m represents either 0 or 1].

4. A method for forming a resist pattern according to claim 1, wherein said acid generator component (B)' is an oxime sulfonate-based acid generator.

5. A method for forming a resist pattern according to claim 1, wherein the positive resist composition further includes a nitrogen-containing organic compound (D).

UNITED STATES PATENT AND TRADEMARK OFFICE
CERTIFICATE OF CORRECTION

PATENT NO. : 7,816,072 B2
APPLICATION NO. : 11/913306
DATED : October 19, 2010
INVENTOR(S) : Hiroshi Shimbori It is certified that error appears in the above-identified patent and that said Letters Patent is hereby corrected as shown below:

Col. 15, lines 31-40, the "R3'" substituent in Formula 7 should be --R3-- as shown below.

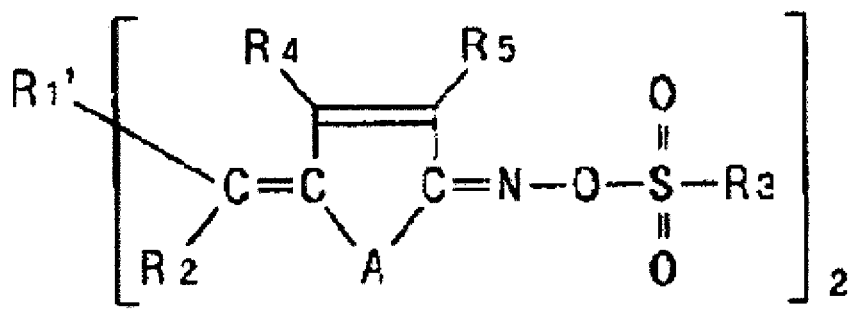

Col. 15, line 66, please delete "(VD)" and insert therefore, --(VI)--.

Col. 26, line 36, please delete "39" and insert therefore, --3'--.

Col. 55, line 39, please delete "10° C." and insert therefore, --110° C.--.

Col. 57, line 22, Claim 1, after "to", please delete "and".

Col. 57, line 24, Claim 1, after "excimer" please insert --laser--.

Signed and Sealed this
Nineteenth Day of April, 2011

David J. Kappos
*Director of the United States Patent and Trademark Office*